(12) United States Patent
Jin

(10) Patent No.: US 11,335,560 B2
(45) Date of Patent: May 17, 2022

(54) SEMICONDUCTOR DEVICES AND FABRICATION METHODS THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Jisong Jin, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 83 days.

(21) Appl. No.: 16/804,454

(22) Filed: Feb. 28, 2020

(65) Prior Publication Data
US 2020/0279739 A1    Sep. 3, 2020

(30) Foreign Application Priority Data
Mar. 1, 2019   (CN) .......................... 201910155834.2

(51) Int. Cl.
| | | |
|---|---|---|
| *H01L 21/00* | (2006.01) | |
| *H01L 21/033* | (2006.01) | |
| *H01L 21/027* | (2006.01) | |
| *H01L 21/311* | (2006.01) | |
| *H01L 21/3115* | (2006.01) | |

(52) U.S. Cl.
CPC ...... *H01L 21/0337* (2013.01); *H01L 21/0276* (2013.01); *H01L 21/31144* (2013.01); *H01L 21/31155* (2013.01)

(58) Field of Classification Search
None
See application file for complete search history.

(56) References Cited

U.S. PATENT DOCUMENTS

| | | | |
|---|---|---|---|
| 10,714,343 B1* | 7/2020 | Chen ................. | H01L 21/31111 |
| 2020/0279738 A1* | 9/2020 | Shi ..................... | H01L 21/76877 |
| 2020/0279740 A1* | 9/2020 | Jin ..................... | H01L 21/31144 |
| 2020/0279741 A1* | 9/2020 | Shi ..................... | H01L 21/31155 |

\* cited by examiner

*Primary Examiner* — Reema Patel
(74) *Attorney, Agent, or Firm* — Anova Law Group, PLLC

(57) ABSTRACT

A method for fabricating a semiconductor device includes providing a to-be-etched layer, including alternately arranged first regions and second regions along a first direction. Each second region includes a trench region. The method includes forming a first mask layer on the to-be-etched layer; forming a doped separation layer in the first mask layer on the second region of the to-be-etched layer to divide the first mask layer along a second direction perpendicular to the first direction; forming a first trench in the first mask layer on the first region; forming a separation filling layer to divide the first trench along the second direction; implanting doping ions into the first mask layer outside of the trench region; and removing the first mask layer formed in the trench region on both sides of the doped separation layer to form a second trench that is divided into portions along the second direction.

17 Claims, 19 Drawing Sheets

SEMICONDUCTOR DEVICES AND FABRICATION METHODS THEREOF

CROSS-REFERENCES TO RELATED APPLICATIONS

This application claims the priority of Chinese Patent Application No. CN201910155834.2, filed on Mar. 1, 2019, the entire content of which is incorporated herein by reference.

FIELD OF THE DISCLOSURE

The present disclosure generally relates to the field of semiconductor fabrication technology and, more particularly, relates to semiconductor devices and fabrication methods thereof.

BACKGROUND

In the process of fabricating semiconductor devices, a photolithography process is usually adopted to transfer the pattern from a mask to a substrate. The photolithography process includes: providing a substrate; forming a photoresist layer on the substrate; exposing and developing the photoresist layer to form a patterned photoresist layer, such that the pattern on the mask is transferred to the photoresist layer; etching the substrate using the patterned photoresist layer as a mask, such that the pattern on the photoresist layer is transferred to the substrate; and removing the photoresist layer.

With the size of semiconductor device continuously becoming smaller, the critical photolithography dimension gradually approaches or even exceeds the physical limits of the photolithography process, which leads to more serious challenges to the photolithography technique. A dual reconstruction technique is adopted in order to overcome these challenges. The basic idea of the dual reconstruction technique is to form the final target pattern through a double-patterning process, such that the photolithography limits for a single-patterning process may be overcome. That is, a critical dimension that cannot be realized by a single-patterning process may be achieved through a double-patterning process.

However, the performance of semiconductor devices fabricated based on existing technology may still need to be improved, the disclosed semiconductor structures and fabrication methods thereof are directed to solve one or more problems set forth above and other problems in the art.

BRIEF SUMMARY OF THE DISCLOSURE

One aspect of the present disclosure provides a method for fabricating a semiconductor device. The method includes providing a to-be-etched layer, including a plurality of first regions and a plurality of second regions arranged alternately along a first direction. For a first region of the plurality of first regions adjacent to a second region of the plurality of second regions, the first region and the second region adjoin each other. The second region of the plurality of second regions includes a trench region adjoining the adjacent first region. The method further includes forming a first mask layer on the to-be-etched layer in both the plurality of first regions and the plurality of second regions; and forming a doped separation layer in the first mask layer on the second region of the to-be-etched layer with the doped separation layer dividing the first mask layer formed in the trench region into portions arranged in a second direction perpendicular to the first direction; forming a first trench in the first mask layer on the first region of the to-be-etched layer; forming a separation filling layer in the first trench with the separation filling layer dividing the first trench into portions arranged in the second direction; implanting doping ions into the first mask layer formed outside of the trench region of the second region; and removing the first mask layer formed in the trench region on both sides of the doped separation layer to form a second trench in the first mask layer on the second region of the to-be-etched layer. The doped separation layer divides the second trench into portions arranged in the second direction.

Another aspect of the present disclosure provides a semiconductor device. The semiconductor device includes a to-be-etched layer, including a plurality of first regions and a plurality of second regions arranged alternately along a first direction. For a first region of the plurality of first regions adjacent to a second region of the plurality of second regions, the first region and the second region adjoin each other. The semiconductor device also includes a first mask layer formed on the to-be-etched layer and implanted with doping ions; a plurality of first trenches, formed in the first mask layer of the plurality of first regions with each first trench divided into portions arranged in a second direction perpendicular to the first direction by a separation filling layer; a plurality of second trenches, formed in the first mask layer of the plurality of the second regions with each second trench divided into portions arranged in the second direction by a doped separation layer; and a sidewall spacing layer, serving as sidewalls of each first trench of the plurality of first trenches.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

FIGS. 1-5 illustrate schematic views of semiconductor structures at certain stages of a fabrication process of a semiconductor device.

Figure 1:
FIGS. 1-5 illustrate schematic views of semiconductor structures at certain stages of a process for fabricating a semiconductor device.

Referring to FIG. 1, a to-be-etched layer 100 is provided. The to-be-etched layer 100 includes a plurality of discrete first regions A01 and a plurality of discrete second regions A02. The plurality of first regions A01 and the plurality of second regions A02 are arranged alternately along a first direction X. For a first region A01 adjacent to a second region A02, the first region A01 and the second region A02 adjoin each other, e.g., the first region A01 and the second region A02 share an edge.

Figure 2:
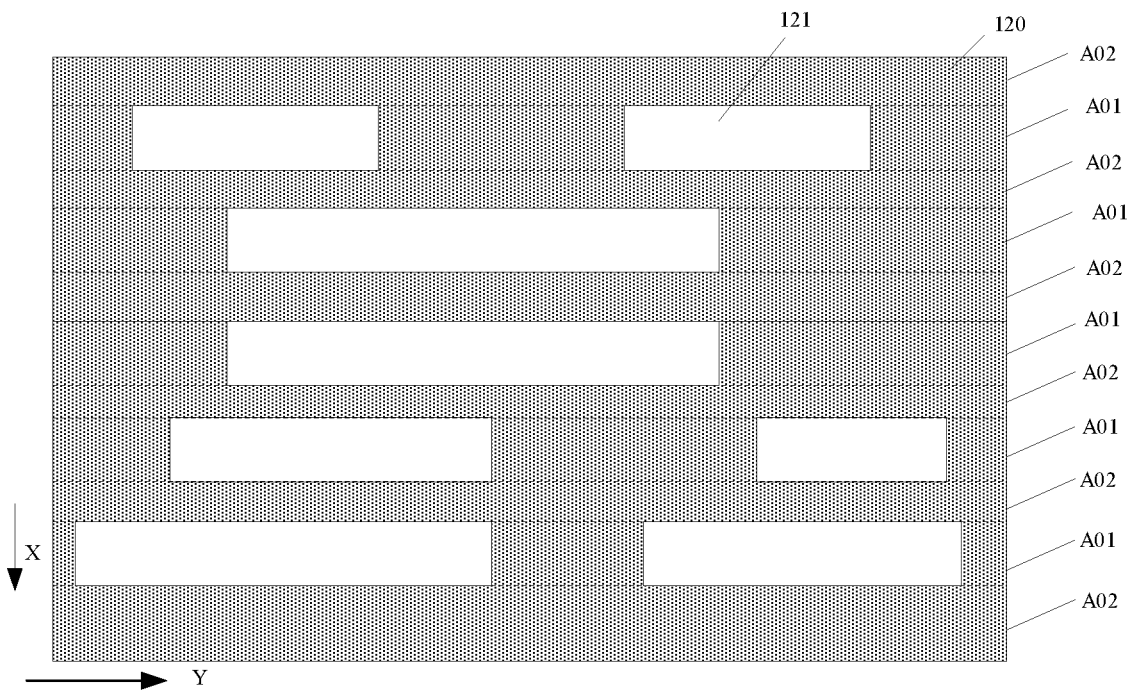

Referring to FIG. 2, a first mask layer 120 is formed on the plurality of first regions A01 and the plurality of second regions A02 of the to-be-etched layer 100, and a plurality of first trenches 121 is formed in the first mask layer 120 of the plurality of first regions A01.

Figure 3:
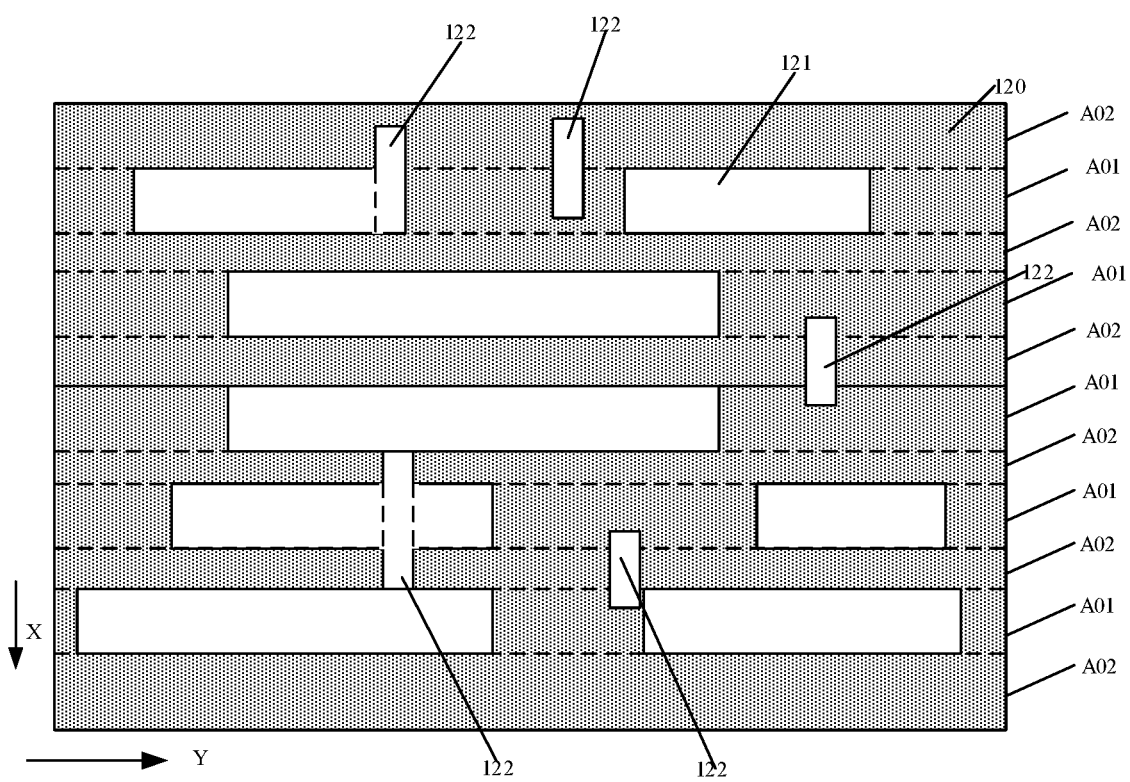

Referring to FIG. 3, a plurality of separation trenches 122 is formed in the first mask layer 120 of the plurality of second regions A02. The extension direction of each separation trench 122 is parallel to the first direction. The separation trench 122 can also extends to the first region A01. Some separation trenches 122 among the plurality of separation trenches 122 are connected with the plurality of first trenches 121, and some other separation trenches 122 among the plurality of separation trenches 122 are separated from each other.

Figure 4:
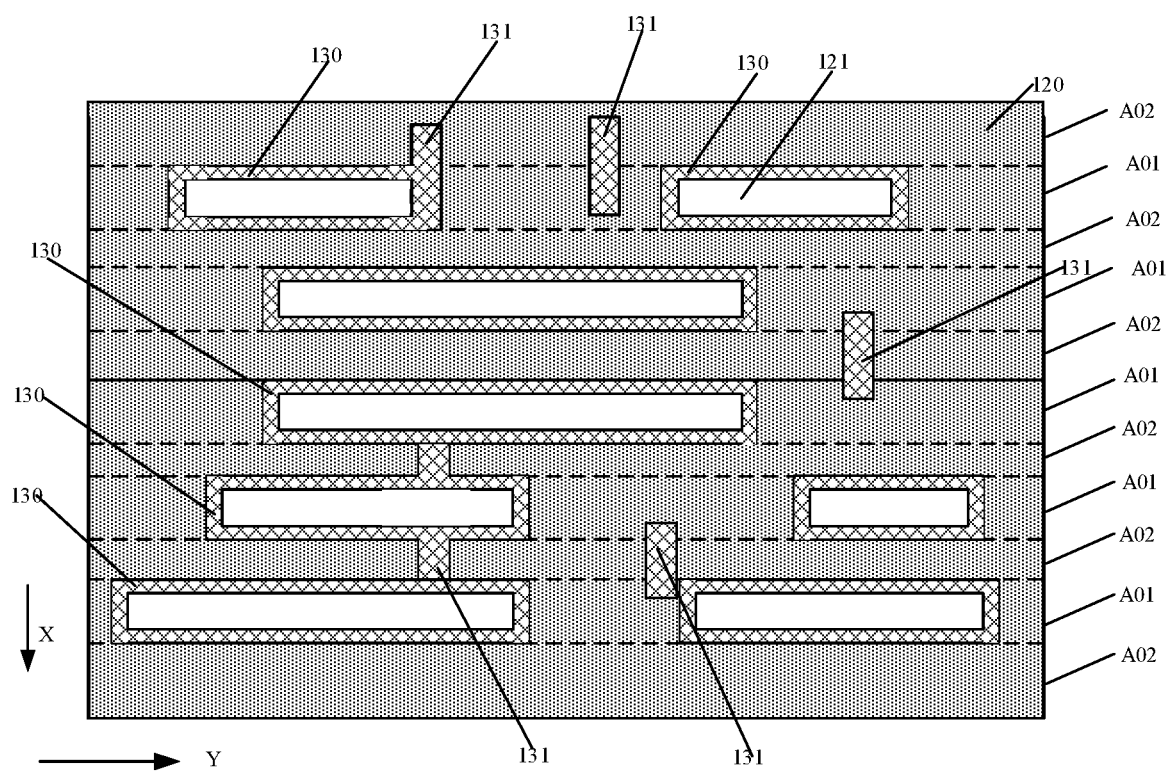

Referring to FIG. 4, a sidewall spacing layer 130 is formed on the sidewalls of each first trench 121. During the process of forming the sidewall spacing layer 130, a separation mask layer 131 is formed in each separation trench 122. The separation mask layer 131 fills up the plurality of separation trenches 122 on the second region A02.

In a second direction Y which is perpendicular to the first direction X, the thickness of the separation mask layer 131 is smaller than or equal to two times of the thickness of the sidewall spacing layer 130.

Figure 5:
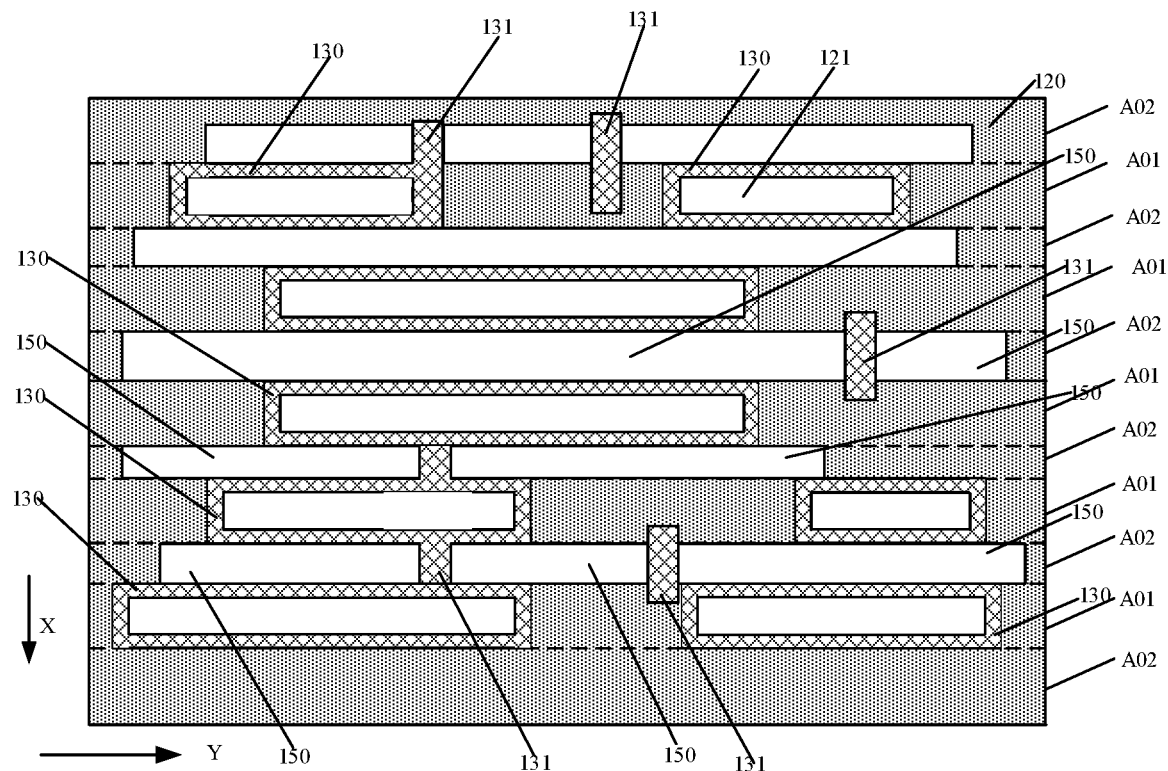

Referring to FIG. 5, after forming the sidewall spacing layer 130 and the separation mask layer 131, a plurality of discrete second trenches 150 is formed in the first mask layer 120 of the plurality of second regions A02. The sidewall spacing layer 130 is exposed in each second trench 150 and thus serves as the sidewall of the second trench 150. Along the second direction Y, the second trench 150 is divided into two portions in the second direction Y by the separation mask layer 131 formed on the second region A02. That is, in the second direction Y, the separation mask layer 131 is sandwiched by the two portions of the second trench 150.

The separation trench 122 (referring to FIG. 3) may extend to the first region A01, or may be connected with a corresponding first trench 121. In addition, along the first direction X, the width of the first trench 121 is larger than the width of the separation trench 122. Therefore, even when some of the plurality of separation trenches 122 are connected to the plurality of first trenches 121, during the process of forming the sidewall spacing layer 130, the sidewall spacing layer 130 is not able to fill up the region where the separation trench 122 is connected to the corresponding first trench 121, such that the first trench 121 may not be divided into portions arranged in the second direction Y by the separation mask layer 131. For the separation trenches 122 that are separated from the plurality of first trenches 121, the separation trench may still be able to extend to the first region A01, such that the separation mask layer 131 may not be able to divide the first trench 121 into portions arranged in the second direction Y. As such, after forming the separation mask layer 131, the separation mask layer 131 may be able to completely divide the first mask layer 120 on the second region A02, but may not be able to divide the first trench 121. During the process of forming the plurality of discrete second trenches 150, because of the blocking of the separation mask layer 131, the second trench 150 may be completely divided into portions arranged in the second direction Y by the separation mask layer 131.

According to the fabrication method of the semiconductor device, it is desired to have the first trench 121 completely divided. Moreover, the region where the first trench 121 is intended to be divided may need to be spaced away from the region of the separation mask layer 131 in the second direction Y.

According to one method, a plurality of separation structures may be formed in the first mask layer 120 of the plurality of first regions A01. The plurality of separation structures may be able to divide the plurality of first trenches 21 to form a plurality of discrete first sub-trenches.

However, in order to ensure a distance from the region where the first trench 121 is intended to be divided to the region of the separation mask layer 131 in the second direction Y, the separation structure may not extend to the first mask layer 120 corresponding to the position of the second trench 150, such that the size of the separation structure in the first direction X may have fewer restrictions. In order to ensure a small distance between the two first sub-trenches on the two sides of the separation structure, the size of the separation structure in the second direction Y needs to be small. As such, the separation structure not only needs to have a small size in the first direction, but also requires a small size in the second direction. The position of the separation structure is directly defined by the lithography opening formed in the lithography layer. Therefore, the size of the lithography opening needs to be small in both the first direction and the second direction, and thus the challenge to the photolithography process may be significant, and the process difficulty may also increase.

The present disclosure provides a method for forming semiconductor devices. The method includes forming a doped separation layer in the first mask layer of the plurality of second regions, the doped separation layer dividing the first mask layer formed in a trench region into portions arranged in a second direction perpendicular to the first direction; forming a plurality of first trenches in the first mask layer of the plurality of first regions; forming a separation filling layer in the plurality of first trenches, the separation filling layer dividing the first trench into portions arranged in the second direction; after forming the separation filling layer, implanting doping ions into the first mask layer formed outside of the trench region; after implanting the doping ions into the first mask layer formed outside of the trench region, removing the portion of the first mask layer formed in the trench region on both sides of the doped separation layer to form a plurality of second trenches in the first mask layer of the plurality of second regions, the doped separation layer dividing the second trench into portions arranged in the second direction. According to the disclosed fabrication method, the process difficulty may be reduced.

Figure 34:
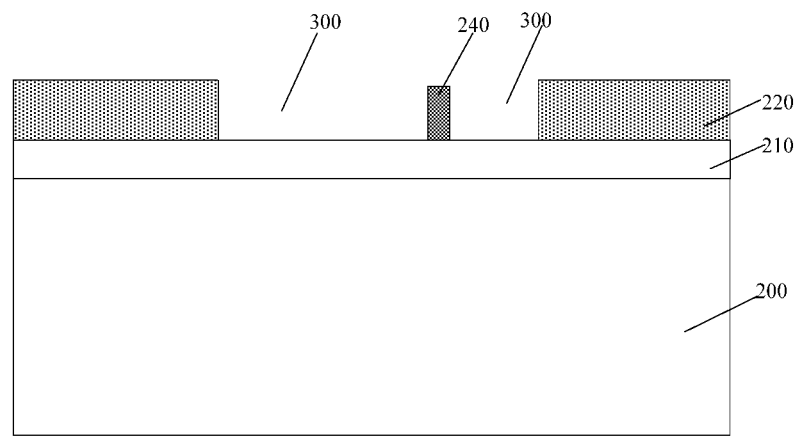
Figure 35:
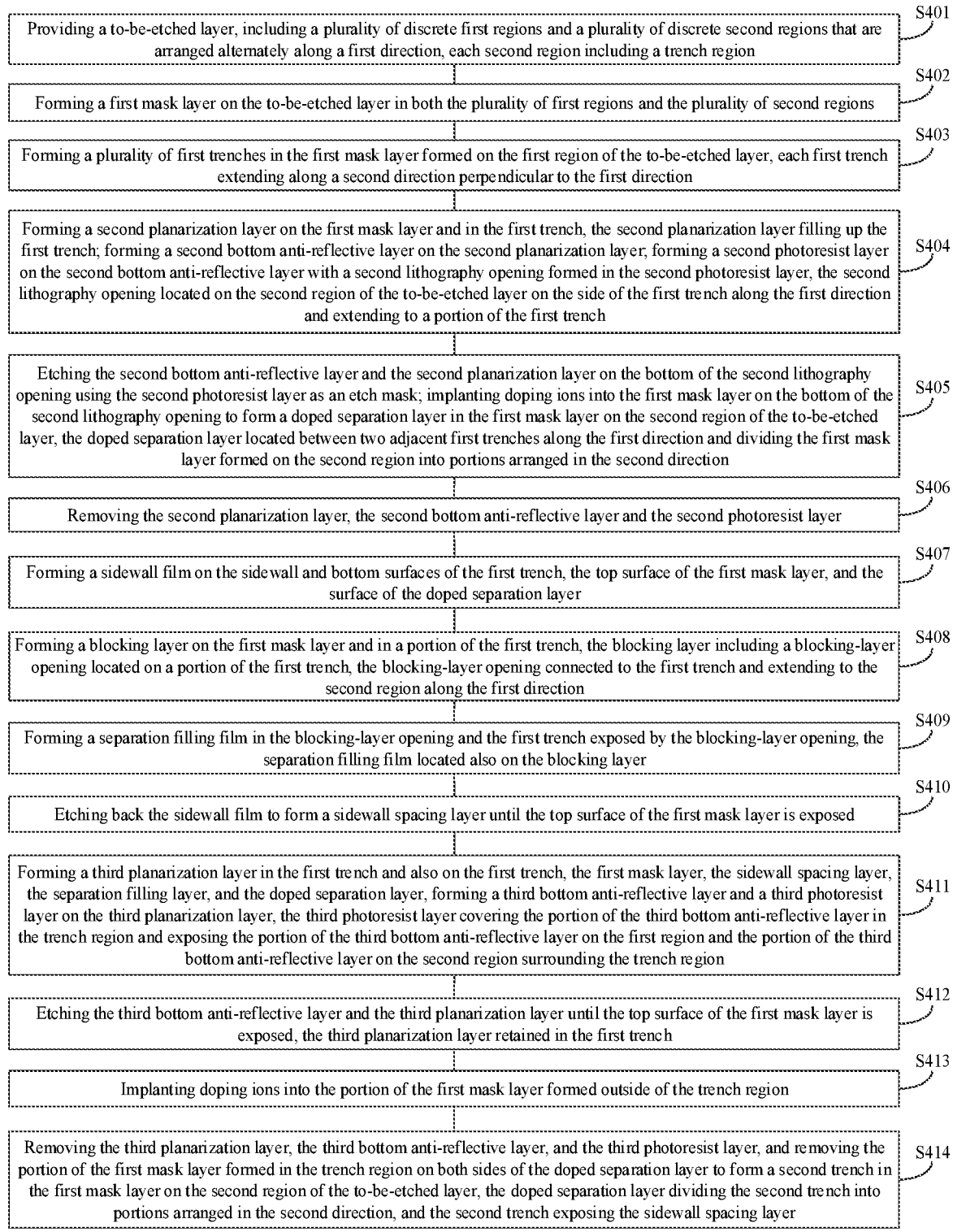
FIG. 35 illustrates a flowchart of an exemplary method for fabricating a semiconductor device consistent with various embodiments of the present disclosure.

FIG. 35 illustrates a flowchart of an exemplary method for fabricating a semiconductor device consistent with various embodiments of the present disclosure. FIGS. 6-34 illustrate schematic views of semiconductor structures at certain stages of the exemplary method.

Figure 6:
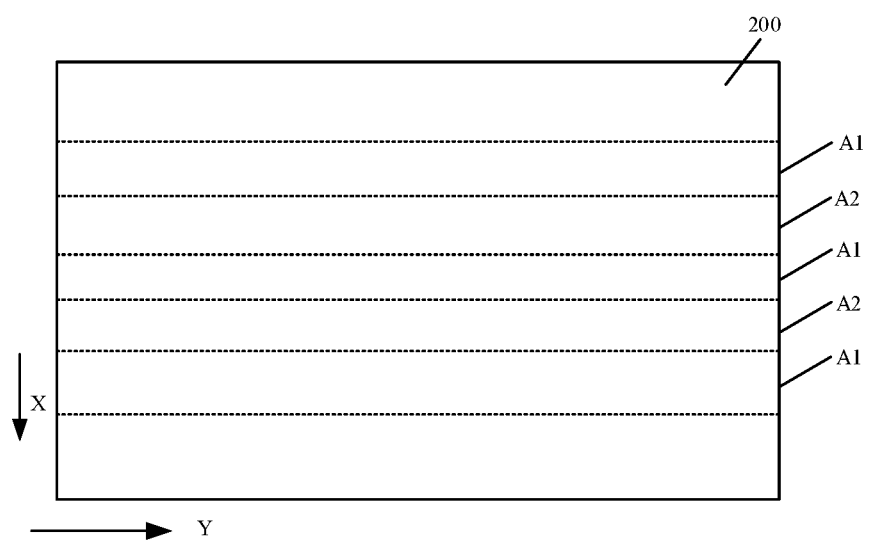
FIGS. 6-34 illustrate schematic views of semiconductor structures at certain stages of an exemplary method for fabricating a semiconductor device consistent with some embodiments of the present disclosure.

Referring to FIG. 35, at the beginning of the fabrication process, a to-be-etched layer may be provided, the to-be-etched layer may include a plurality of discrete first regions and a plurality of discrete second regions that are arranged alternately along a first direction (S401). FIG. 6 illustrates a schematic top view of a semiconductor structure consistent with various embodiments of the present disclosure.

Referring to FIG. 6, a to-be-etched layer 200 may be provided. The to-be-etched layer 200 may include a plurality of discrete first regions A1 and a plurality of discrete second regions A2. The plurality of first regions A1 and the plurality of second regions A2 may be arranged alternately along a first direction X. For a first region A1 adjacent to a second region A2, the first region A1 and the second region A2 may adjoin each other, e.g., the first region A1 and the second region A2 may share an edge.

In one embodiment, the plurality of first regions A1 may be arranged along the first direction X, and the plurality of second regions A2 may also be arranged along the first direction X. The plurality of first regions A1 and the plurality of second regions A2 arranged alternatively along the first direction X may refer to that only one second region A2 may be located between two adjacent first regions A1, and only one first region A1 may be located between two adjacent second regions A2. In some embodiments, the total number of the first regions may equal to the total number of the second regions.

In one embodiment, the to-be-etched layer 200 may be made of a material including silicon oxide or a low-k dielectric material (e.g., a material with a relative dielectric constant k smaller than or equal to 3.9).

Figure 7:
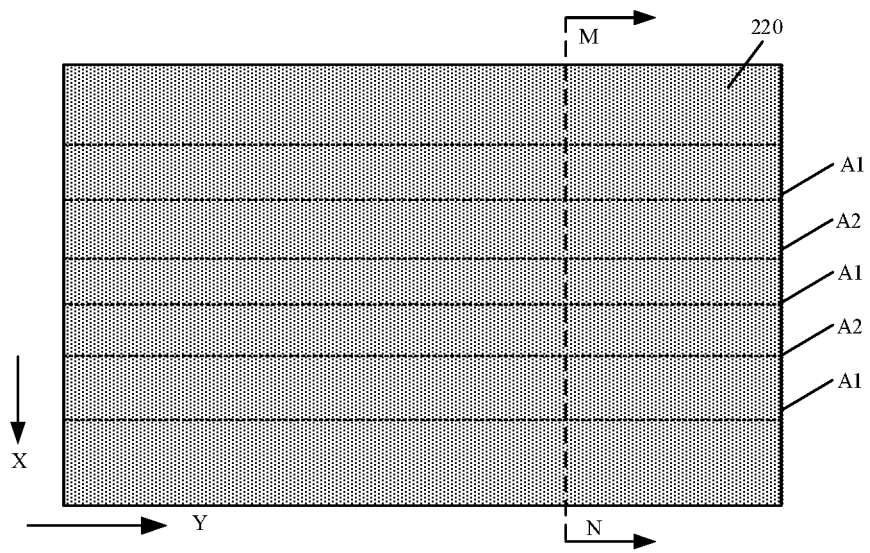
Figure 8:
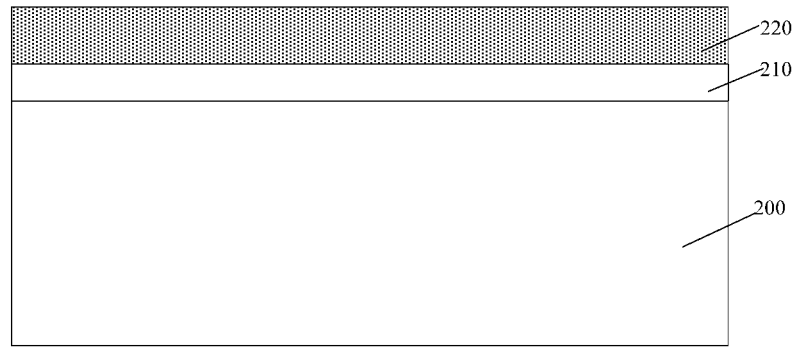

Further, returning to FIG. 35, a first mask layer may be formed on the to-be-etched layer in both the plurality of first regions and the plurality of second regions (S402). FIGS. 7-8 illustrate schematic views of a semiconductor structure consistent with various embodiments of the present disclosure. Specifically, FIG. 7 shows the semiconductor structure from a view direction consistent with that in FIG. 6, that is, FIG. 7 illustrates a schematic top view of the semiconductor structure; and FIG. 8 illustrates a schematic cross-sectional view of the semiconductor structure shown in FIG. 7 in an M-N direction.

Referring to FIGS. 7-8, a first mask layer 220 may be formed on the to-be-etched layer 200 in both the plurality of first regions A1 and the plurality of second regions A2. In one embodiment, the first mask layer 220 may be made of a material including amorphous silicon.

In some embodiments, prior to forming the first mask layer 220, the method may further include forming a first adhesive layer (not shown) on the to-be-etched layer 200; forming a bottom hard mask layer 210 on the first adhesive layer; and forming a second adhesive layer (not shown) on the bottom hard mask layer 210. Therefore, the first mask layer 220 may be formed on the second adhesive layer. In one embodiment, the bottom hard mask layer 210 may be made of a material including titanium nitride.

The material used for forming the first adhesive layer may include SiOC, and the material used for forming the second adhesive layer may include SiOC.

In one embodiment, the first adhesive layer may be used to improve the adhesion between the bottom hard mask layer 210 and the to-be-etched layer 200, such that the bonding between the bottom hard mask layer 210 and the to-be-etched layer 200 may be stronger. The second adhesive layer may be used to improve the adhesion between the first mask layer 220 and the bottom hard mask layer 210, such that the bonding between the first mask layer 220 and the bottom hard mask layer 210 may be stronger.

Further, the function of the bottom hard mask layer 210 may also include the following aspects. The bottom hard mask layer 210 may be used as an etch stop layer, e.g., the bottom hard mask layer 210 may be used as a stop layer during a subsequently performed planarization process on a conductive film. The bottom hard mask layer 210 may be made of a hard mask material, such that during subsequent formation of a plurality of first target trenches and a plurality of second target trenches, the etching loss of the bottom hard mask layer 210 may be limited. Therefore, during the process of transferring the pattern in the bottom hard mask layer 210 to the to-be-etched layer 200, the pattern transfer may demonstrate high stability.

In one embodiment, the bottom hard mask layer 210 and the first mask layer 220 may be made of different materials. In other embodiments, the fabrication method may not include forming the bottom hard mask layer, the first adhesive layer, and the second adhesive layer.

Figure 9:
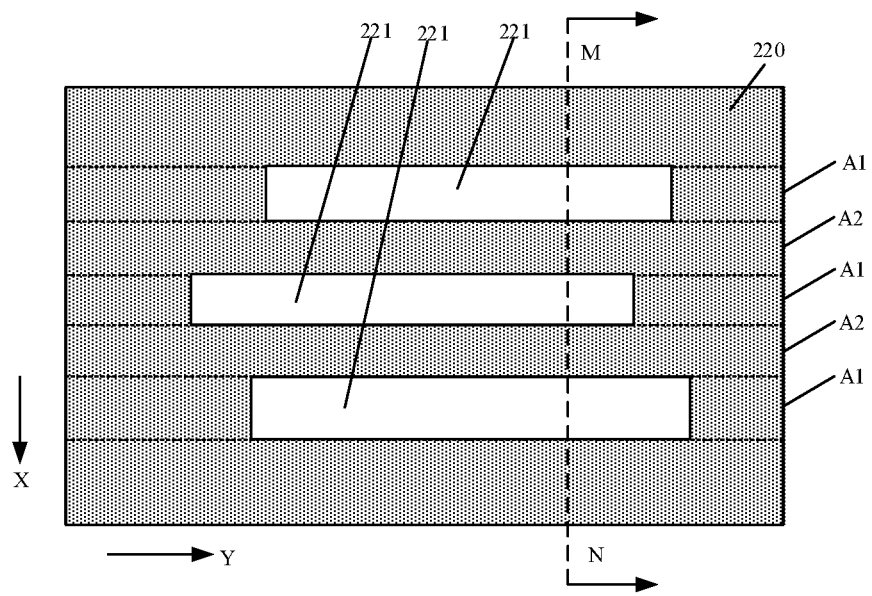
Figure 10:
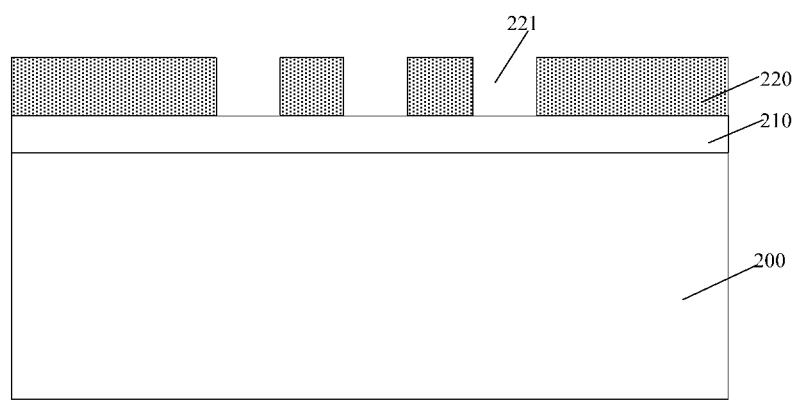

Further, returning to FIG. 35, a plurality of first trenches may be formed in the first mask layer on the first region of the to-be-etched layer, each first trench extending alone a second direction perpendicular to the first direction (S403). FIGS. 9-10 illustrate schematic views of a semiconductor structure consistent with various embodiments of the present disclosure. Specifically, FIG. 9 shows the semiconductor structure from a view direction consistent with that in FIG. 7, and FIG. 10 shows the semiconductor structure from a view direction consistent with that in FIG. 8. That is, FIG. 10 illustrates a schematic cross-sectional view of the semiconductor structure shown in FIG. 9 in the M-N direction.

Referring to FIGS. 9-10, a plurality of first trenches 221 may be formed in the first mask layer 220 on the first region A1 of the to-be-etched layer 200. In one embodiment, each first trench 221 may extend along a second direction Y, which is perpendicular to the first direction X.

In one embodiment, the width of the first trench 221 in the first direction X may be in a range of approximately 10 nm to 60 nm. In the first direction X, the distance between adjacent first trenches 221 may be in a range of approximately 10 nm to 60 nm.

In one embodiment, the process for forming the plurality of first trenches 221 may include a dry etching process, such as an anisotropic dry etching process.

Figure 11:
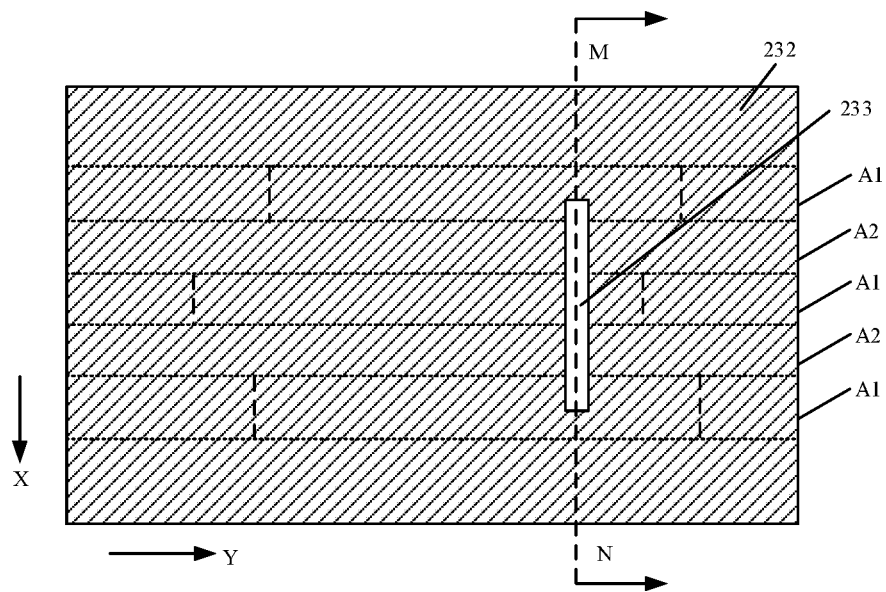
Figure 12:
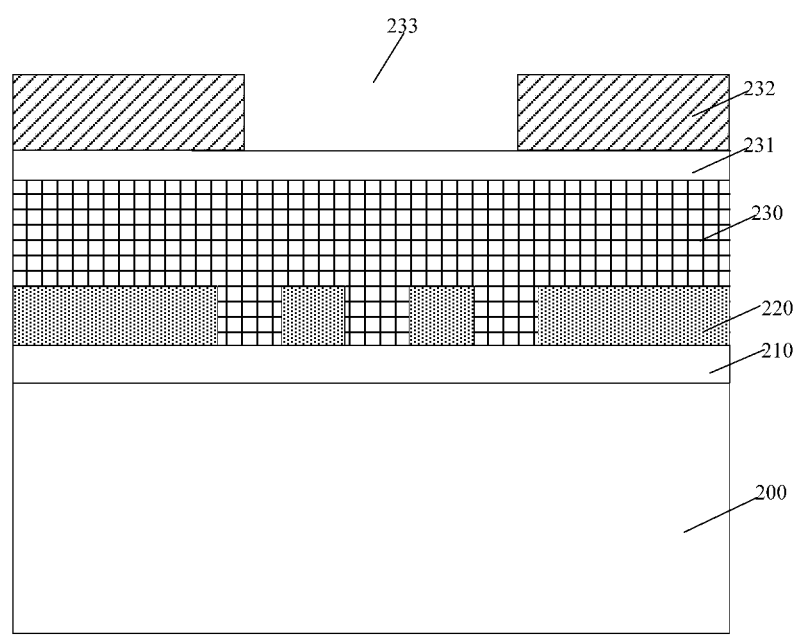

Further, returning to FIG. 35, a second planarization layer may be formed on the first mask layer and in the first trench, the second planarization layer filling up the first trench; a second bottom anti-reflective layer may be formed on the second planarization layer; a second photoresist layer may be formed and patterned on the second bottom anti-reflective layer, such that a second lithography opening may be formed in the second photolithography layer, the second lithography opening located on the second region on the side of the first trench along the first direction, and extending to a portion of the first trench (S404). FIGS. 11-12 illustrate schematic views of a semiconductor structure consistent with various embodiments of the present disclosure. Specifically, FIG. 11 shows the semiconductor structure from a view direction consistent with that in FIG. 9, and FIG. 12 shows the semiconductor structure from a view direction consistent with that in FIG. 10. That is, FIG. 12 illustrates a schematic cross-sectional view of the semiconductor structure shown in FIG. 11 in the M-N direction.

Referring to FIGS. 11-12, a second planarization layer 230 may be formed on the first mask layer 220 and also in the plurality of first trenches 221. The second planarization layer 230 may fill up the plurality of first trenches 221. That is, the top surface of the second planarization layer is above the opening of each first trench 221. A second bottom anti-reflective layer 231 may be formed on the second planarization layer 230, and a second photoresist layer 232 may be formed and patterned on the second bottom anti-reflective layer 231. After patterning the second photoresist layer 232, a plurality of second lithography openings 233 may be formed in the second photoresist layer 232. The second lithography opening 233 may be formed on the second region A2 on the side of the first trench along the first direction X. The second lithography opening 233 may also extend to a portion of the first trench 221.

In one embodiment, the extension direction of the second lithography opening 233 may be parallel to the first direction X. The second opening 233 may extend to a portion of the first trench 221 along the first direction X. The overlapping region of the second lithography opening 233 and the portion of the first mask layer 220 located between adjacent first trenches 221 may be used to define the position of a subsequently-formed doped separation layer.

The width of the second lithography opening 223 in the second direction Y may be used to define the size of the subsequently-formed separation layer in the second direction. Because the size of the doped separation layer may need to be small in the second direction Y, the width of the second lithography opening 233 may be small in the second direction Y. For example, in one embodiment, the width of the second lithography opening 223 in the second direction Y may be in a range of approximately 20 nm to 60 nm, e.g. 20 nm, 30 nm, 40 nm, 50 nm, or 60 nm.

The second lithography opening 223 may also extend to a portion of the first trench 221. Therefore, the size of the second lithography opening 223 in the first direction X may be allowed to be made large, such that the size of the second lithography opening 223 may only need to be limited in the second direction Y, while the size of the second lithography opening 223 in the first direction X may not need to be defined small. As such, the challenge on the photolithography process may be lowered, and the process difficulty may be reduced. In one embodiment, the size of the second lithography opening 233 in the first direction X may be in a range of approximately 65 nm to 1000 nm, e.g. 80 nm, 100 nm, or 200 nm.

Figure 13:
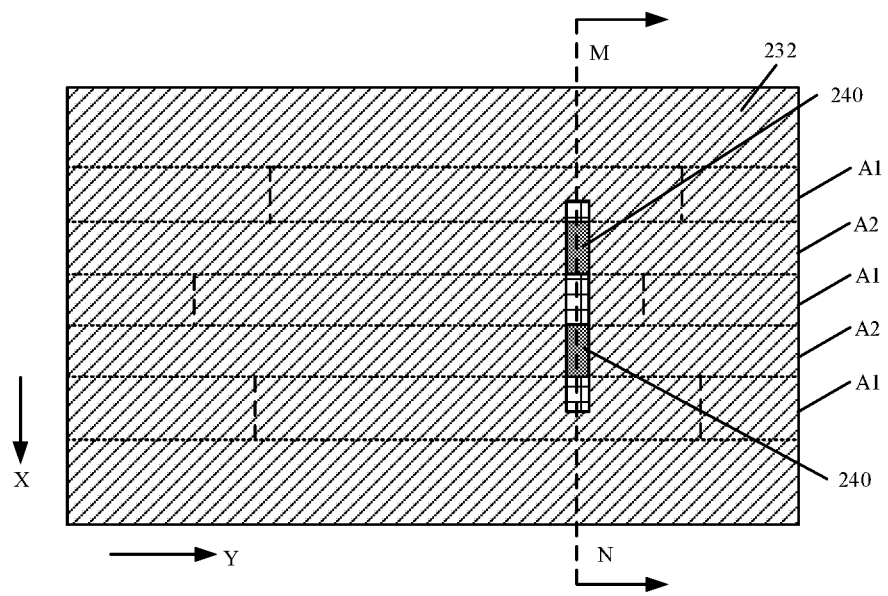
Figure 14:
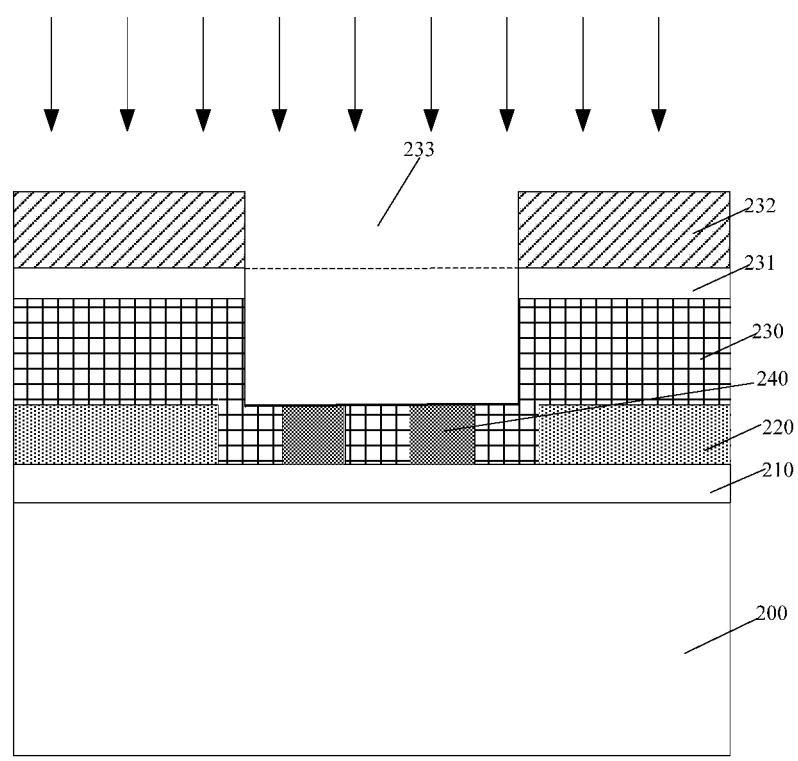

Further, returning to FIG. 35, the second bottom anti-reflective layer and the second planarization layer on the bottom of the second lithography opening may be etched using the second photoresist layer as an etch mask until the top surface of the first mask layer is exposed, and then doping ions may be implanted into the first mask layer on the bottom of the second lithography opening using the second photoresist layer and the second planarization layer as a mask, such that a doped separation layer may be formed in the first mask layer on the second region of the to-be-etched layer, the doped separation layer dividing the first mask layer formed on the second region into portions arranged in the second direction and located between two adjacent first trenches along the first direction (S405). FIGS. 13-14 illustrate schematic views of a semiconductor structure consistent with various embodiments of the present disclosure. Specifically, FIG. 13 shows the semiconductor structure from a view direction consistent with that in FIG. 11, and FIG. 14 shows the semiconductor structure from a view direction consistent with that in FIG. 12. That is, FIG. 14 illustrates a schematic cross-sectional view of the semiconductor structure shown in FIG. 13 in the M-N direction.

Referring to FIGS. 13-14, the second bottom anti-reflective layer 231 and the second planarization layer 230 on the bottom of the second lithography opening 233 may be etched using the second photoresist layer 232 as an etch mask until the top surface of the first mask layer 220 is exposed. The first trench 221 may be filled with the second planarization layer 230. Further, doping ions may be implanted into the first mask layer 220 on the bottom of the second lithography opening 233 using the second photoresist layer 232 and the second planarization layer 230 as a mask, such that a doped separation layer 240 may be formed in the first mask layer 220 on the second region A2 of the to-be-etched layer 200. After ion implantation, the doped separation layer 240 may divide the first mask layer 220 formed on the second region A2 into portions arranged in the second direction Y, and the doped separation layer 240 may be located between two adjacent first trenches 221 along the first direction X.

Because the overlapping region of the second lithography opening 223 and the portion of the first mask layer 220 located between adjacent first trenches 221 may be used to define the position of the subsequently-formed doped separation layer 240, the size of the doped separation layer 240 may be small in the first direction X. The width of the second lithography opening 233 in the second direction Y may be used to define the size of the doped separation layer 240 in the second direction Y. Therefore, when the width of the second lithography opening 233 in the second direction Y is small, the size of the doped separation layer in the second direction Y may also be small.

In one embodiment, the doped separation layer 240 may not extend to the first region A1, and thus the doped separation layer 240 may not affect the position where the first trench is divided.

In one embodiment, the size of the doped separation layer 240 in the first direction X may be in a range of approximately 10 nm to 60 nm, and the size of the doped separation layer 240 in the second direction Y may be in a range of approximately 10 nm to 40 nm. The doping ions used for forming the doped separation layer 240 may include boron ions and arsenic ions.

It should be noted that during the process of forming the doped separation layer 240 by implanting doping ions into the first mask layer 220 on the bottom of the second lithography opening 233, the second planarization layer 230 located in the first trench 221 may be able to prevent the doping ions form being implanted into the material layer at the bottom of the first trench 221.

Figure 15:
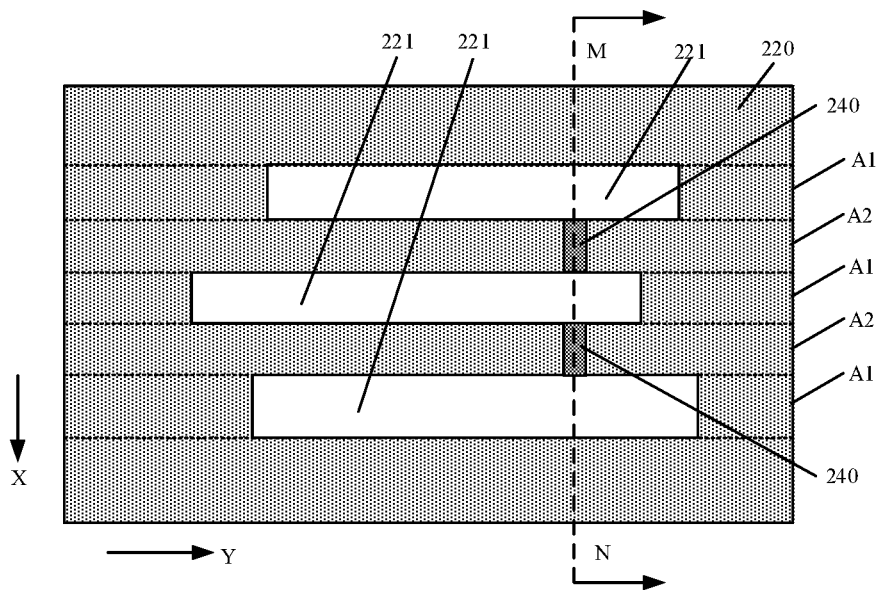
Figure 16:
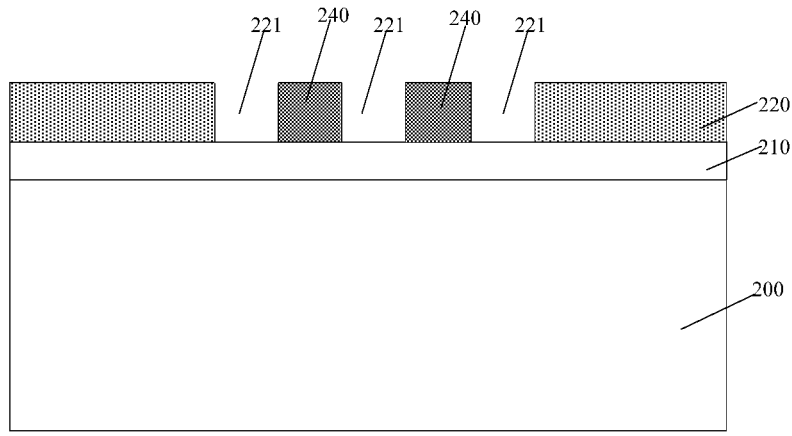

Further, returning to FIG. 35, after implanting doping ions into the portion of the first mask layer at the bottom of the second lithography opening, the second planarization layer, the second bottom anti-reflective layer, and the second photoresist layer may be removed (S406). FIGS. 15-16 illustrate schematic views of a semiconductor structure consistent with various embodiments of the present disclosure. Specifically, FIG. 15 shows the semiconductor structure from a view direction consistent with that in FIG. 13, and FIG. 16 shows the semiconductor structure from a view direction consistent with that in FIG. 14. That is, FIG. 16 illustrates a schematic cross-sectional view of the semiconductor structure shown in FIG. 15 in the M-N direction.

Referring to FIGS. 15-16, after implanting the doping ions into the portion of the first mask layer 220 located at the bottom of the second lithography opening 223, the second planarization layer 230, the second bottom anti-reflective layer 231, and the second photoresist layer 232 may be removed.

In one embodiment, the doped separation layer 240 may be formed after the formation of the plurality of first trenches 221. As such, the position of the doped separation layer 240 may be accurately located between the adjacent first trenches 221, and the topography of both sidewalls of the doped separation layer 240 in the first direction X may be consistent with the topography of the first mask layer 220 exposed by both sidewalls of the first trench 221 in the first direction X, so that the width of a first conductive layer fabricated in a subsequent process may be uniform.

In other embodiments, the plurality of first trenches may be formed after forming the doped separation layer.

It should be noted that the plurality of first trenches may be formed by etching the first mask layer through a dry etching process. When the first trench is formed after forming the doped separation layer, it may require the etching rate of the portion of the doped first mask layer to be similar to the etching rate of the portion of the undoped first mask layer during the dry etching process performed to form the first trench. That is, during the dry etching process, the influence of the doping ions on the etching effect of the first mask layer may be insignificant.

Further, a separation filling layer may be formed in the first trench 221. The separation filling layer may divide the first trench 221 into portions arranged in the second direction Y.

In one embodiment, the second region A2 may include a trench region. The trench region may be used to define the position of a second trench that is subsequently formed. The trench region may be adjacent to a first region, and the trench region may be located on the side of the first trench along the first direction X.

After forming the doped separation layer 240 in the first mask layer 220 on the second region A2, the doped separation layer 240 may divide the first mask layer 220 formed in the trench region into portions arranged in the second direction. In addition, the doped separation layer 240 on the second region may be located between adjacent first trenches 221 in the first direction. Further, the fabrication method may include forming a sidewall spacing layer on the sidewalls of the first trench 221. In one embodiment, the separation filling layer may be formed after forming the doped separation layer. After forming the sidewall spacing layer and the separation filling layer, the method may further include implanting doping ions into the portion of the first mask layer formed outside of the trench region; after implanting doping ions into the portion of the first mask layer formed outside of the trench region, forming a second trench in the first mask layer on the second region of the to-be-etched layer by removing the portion of the first mask layer formed in the trench region on both sides of the doped separation layer through an etching process. The doped separation layer may divide the second trench into portions arranged in the second direction, and the sidewalls of the second trench may expose the sidewall spacing layer.

In one embodiment, the separation filling layer may be formed during the process of forming the sidewall spacing layer. In other embodiments, the separation filling layer may be formed after forming the sidewall spacing layer, or the sidewall spacing layer may be formed after forming the separation filling layer.

In one embodiment, during the process of forming the sidewall spacing layer, the separation filling layer may be formed. The material of the separation filling layer may be different from the material of the sidewall spacing layer.

In one embodiment, the method for forming the sidewall spacing layer and the separation filling layer may include forming a sidewall film on the sidewall and bottom surfaces of the first trench, the top surface of the first mask layer, and the surface of the doped separation layer; and then forming a blocking layer on the first mask layer and in a portion of the first trench. The blocking layer may include a blocking-layer opening located on a portion of the first trench, and the blocking layer may also be formed on the sidewall film. The blocking-layer opening and the first trench may be connected to each other, and the blocking-layer opening may also extend to the second region along the first direction. After forming the blocking layer, the method may include forming a separation filling film in the blocking-layer opening and the first trench that is exposed by the blocking-layer opening, and also on the blocking layer. The separation filling film may also be formed on the sidewall film. The method may further include forming the separation filling layer by etching back the separation filling film and the blocking layer until the surface of the sidewall film formed on the top surface of the first mask layer is exposed. The process of etching back the separation filling film and the blocking layer may also remove the blocking layer in the first trench. After etching back the separation filling film and the blocking layer, the method may also include etching back the sidewall film until the top surface of the first mask layer is exposed. As such the sidewall spacing layer may be formed.

Figure 17:
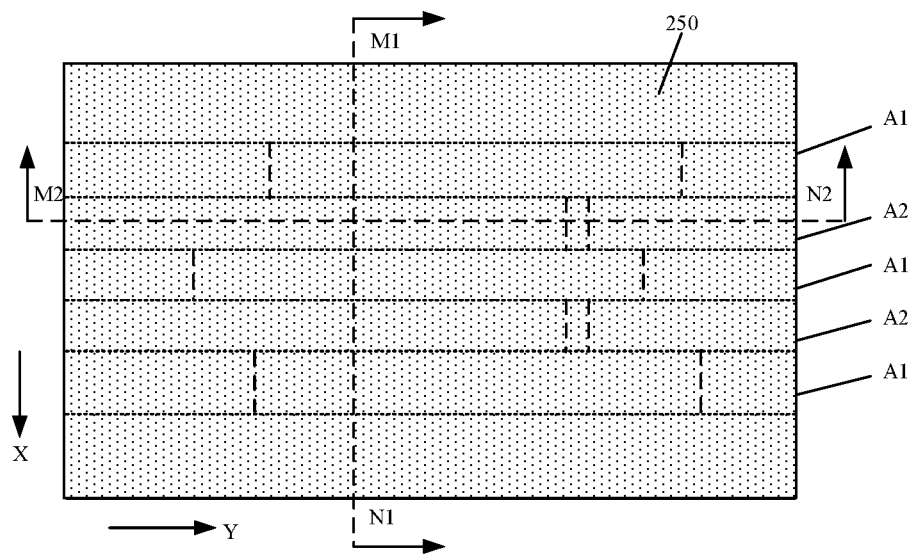
Figure 18:
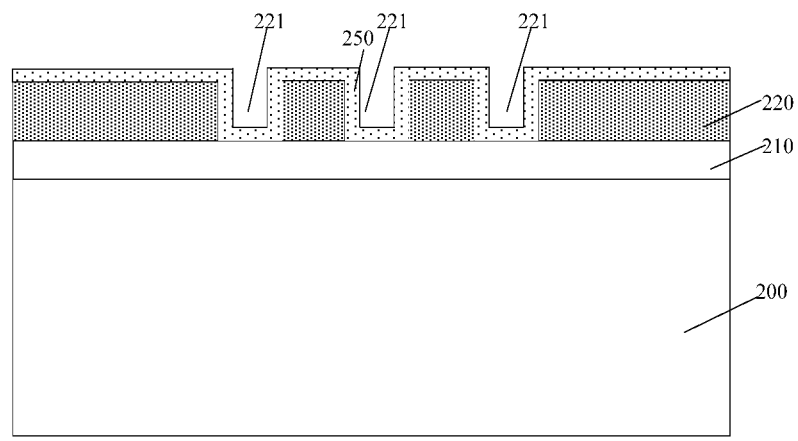
Figure 19:
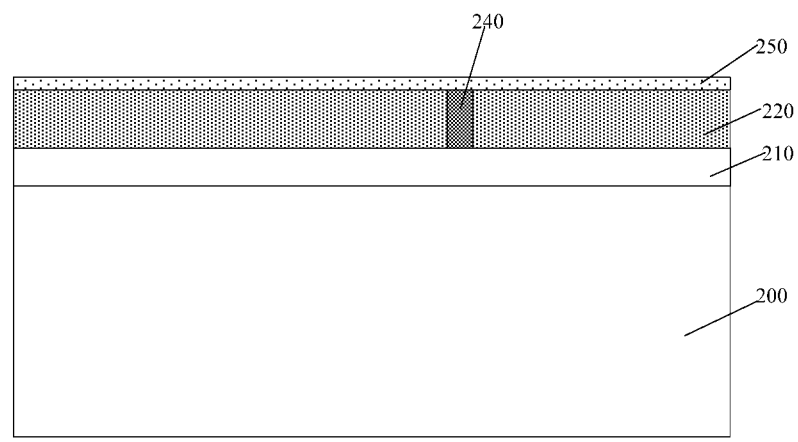

Returning to FIG. 35, a sidewall film may be formed on the sidewall and bottom surfaces of the first trench, the top surface of the first mask layer, and the surface of the doped separation layer (S407). FIGS. 17-19 illustrate schematic views of a semiconductor structure consistent with various embodiments of the present disclosure. Specifically, FIG. 17 shows the semiconductor structure from a view direction consistent with that in FIG. 15, FIG. 18 illustrates a schematic cross-sectional view of the semiconductor structure shown in FIG. 17 in an M1-N1 direction, and FIG. 19 illustrates a schematic cross-sectional view of the semiconductor structure shown in FIG. 17 in an M2-N2 direction.

Referring to FIGS. 17-19, a sidewall film 250 may be formed on the sidewall and bottom surfaces of the first trench 221, the top surface of the first mask layer 220, and the surface of the doped separation layer 240.

In one embodiment, the sidewall film 250 may be made of a material including $SiO_2$, SiN, $TiO_2$, TiN, AlN, or $Al_2O_3$. The process of forming the sidewall film 250 may be a deposition process, such as an atomic layer deposition (ALD) process. In one embodiment, the thickness of the sidewall film 250 may be in a range of approximately 10 nm to 30 nm, e.g. 10 nm, 15 nm, 20 nm, or 30 nm.

Figure 20:
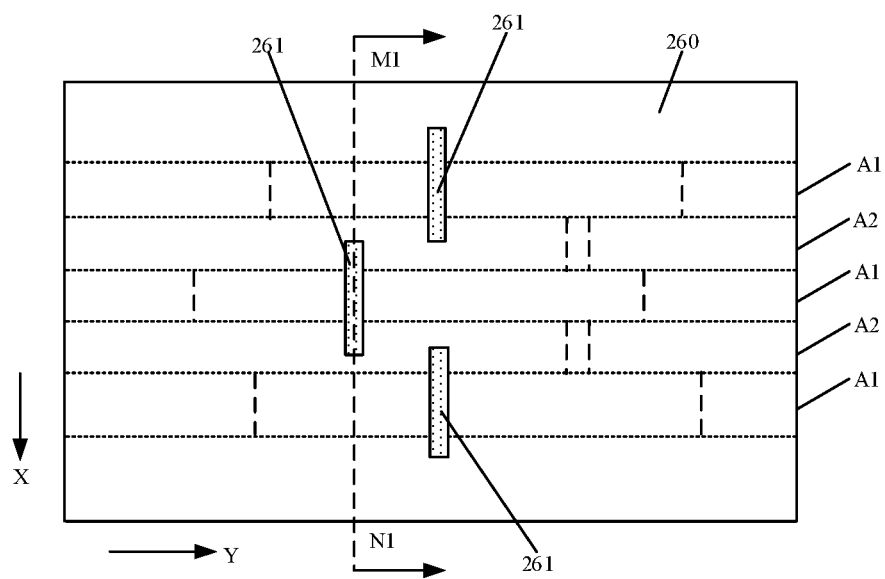
Figure 21:
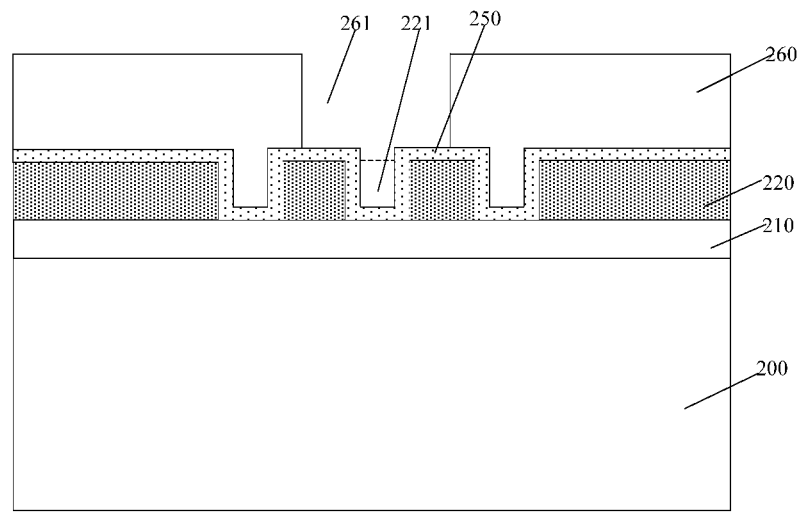

Further, returning to FIG. 35, after forming the sidewall film, a blocking layer may be formed on the first mask layer and in a portion of the first trench, the blocking layer including a blocking-layer opening located on a portion of the first trench, the blocking-layer opening connected to the first trench and extending to the second region along the first direction (S408). FIGS. 20-21 illustrate schematic views of a semiconductor structure consistent with various embodiments of the present disclosure. Specifically, FIG. 20 shows the semiconductor structure from a view direction consistent with that in FIG. 17, and FIG. 21 shows the semiconductor structure from a view direction consistent with that in FIG. 18. That is, FIG. 21 illustrates a schematic cross-sectional view of the semiconductor structure shown in FIG. 20 in the M1-N1 direction.

Referring to FIGS. 20-21, after forming the sidewall film 250, a blocking layer 260 may be formed on the first mask layer 220 and in a portion of the first trench 221. The blocking layer 260 may include a blocking-layer opening 261 located on a portion of the first trench 221, the blocking-layer opening 261 and the first trench 221 may be connected to each other, and the blocking-layer opening 261 may extend to the second region A2 along the first direction X. In one embodiment, the blocking layer 260 may also be formed on the sidewall film 250.

In one embodiment, the extension direction of the blocking-layer opening 261 may be parallel to the first direction X. The blocking layer 260 may be made of a material including a carbon-containing organic polymer.

In one embodiment, the process of forming the blocking layer 260 may include the following exemplary steps. A first planarization film may be formed on the first mask layer 220 and in the first trench 221. A first bottom anti-reflective layer may be formed on the first planarization film. A first photoresist layer may be formed and patterned on the first bottom anti-reflective layer. The first photoresist layer may include a first lithography opening located on a portion of the first trench. The first lithography opening may also extend to the second region A2 along the first direction X. The portion of the first bottom anti-reflective layer and the first planarization film on the bottom of the first lithography opening may be removed through an etching process using the first photoresist layer as an etch mask. As such the first planarization film may form the blocking layer 260. After etching the portion of the first bottom anti-reflective layer and the first planarization film on the bottom of the first lithography opening, the first photoresist layer and the first bottom anti-reflective layer may be removed.

In one embodiment, the first lithography opening may define the position of the blocking-layer opening 261. The extension direction of the first lithography opening may be parallel to the first direction X.

In one embodiment, the overlapping region of the blocking-layer opening 261 and the first trench 221 may be used to define the position of the separation filling layer. For example, the width of the blocking-layer opening 261 in the second direction Y may be used to define the size of the separation filling layer in the second direction Y. Because the size of the separation filling layer may need to be small in the second direction Y, the width of the blocking-layer opening 261 may be small in the second direction Y. For example, in one embodiment, the width of the blocking-layer opening 261 along the second direction Y may be in a range of approximately 10 nm to 40 nm, e.g. 20 nm, 30 nm, or 40 nm.

In one embodiment, because the blocking-layer opening 261 may also extend to the second region A2 along the first direction X, the size of the blocking-layer opening 261 in the first direction X may be allowed to be made large, such that the size of the blocking-layer opening 261 may only need to be limited in the second direction Y, while the size of the blocking-layer opening 261 in the first direction X may not need to be defined small.

In one embodiment, because the first lithography opening defines the position of the blocking-layer opening 261, the size of the first lithography opening in the first direction X may correspond to the size of the blocking-layer opening 261 in the first direction X, and the size of the first lithography opening in the second direction Y may correspond to the size of the blocking-layer opening 261 in the second direction Y. Therefore, the size of the first lithography opening may only need to be limited in the second direction Y, while the size of the first lithography opening in the first direction X may not need to be defined small. As such, the challenge on the photolithography process may be lowered, and the process difficulty may be reduced.

In one embodiment, the width of the first lithography opening in the second direction may be in a range of approximately 65 nm to 1000 nm, e.g. 80 nm, 100 nm, or 200 nm.

Figure 22:
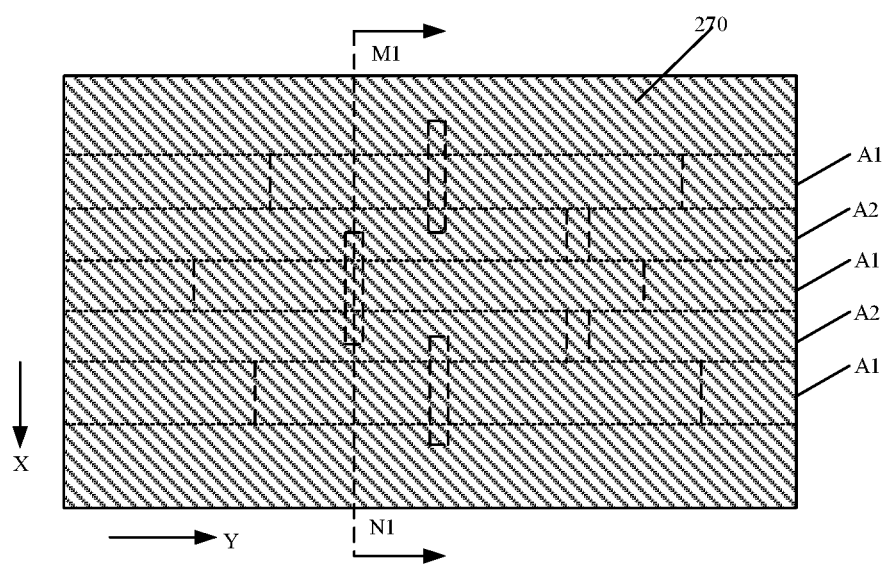
Figure 23:
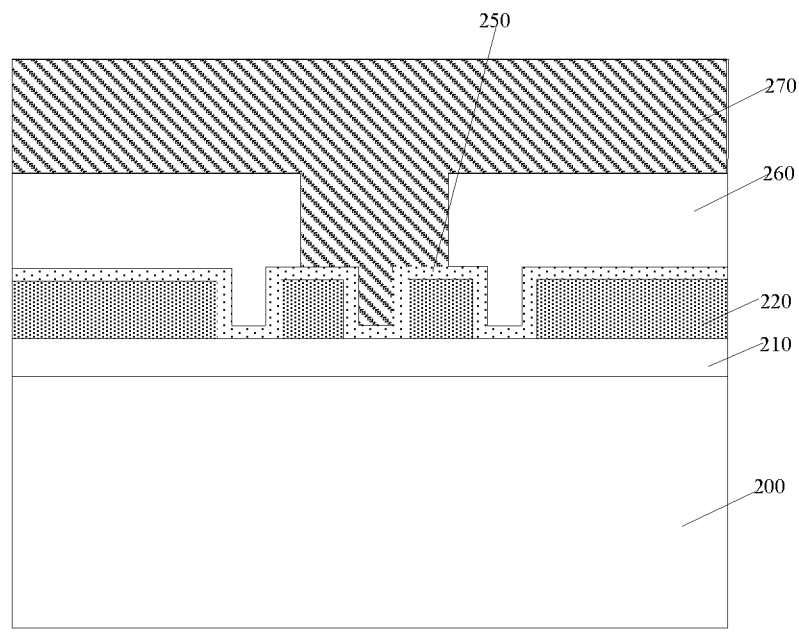

Further, returning to FIG. 35, after forming the blocking layer, a separation filling film may be formed in the blocking-layer opening and the first trench exposed by the blocking-layer opening, and the separation filling film also located on the blocking layer (S409). FIGS. 22-23 illustrate schematic views of a semiconductor structure consistent with various embodiments of the present disclosure. Specifically, FIG. 22 shows the semiconductor structure from a view direction consistent with that in FIG. 20, and FIG. 23 shows the semiconductor structure from a view direction consistent with that in FIG. 21. That is, FIG. 23 illustrates a schematic cross-sectional view of the semiconductor structure shown in FIG. 22 in the M1-N1 direction.

Referring to FIGS. 22-23, after forming the blocking layer 260, a separation filling film 270 may be formed in the blocking-layer opening 261 and the first trench 221 exposed by the blocking-layer opening 261, and also on the blocking layer 260. In one embodiment, the entire surface of the separation filling film 270 may be higher than the top surface of the blocking layer 260.

In one embodiment, the separation filling film 270 may also be formed on the sidewall film 250. The separation filling film 270 may be made of a material including $SiO_2$, SiN, $TiO_2$, TiN, AlN, or $Al_2O_3$. The process of forming the separation filling film 270 may be a deposition process.

Figure 24:
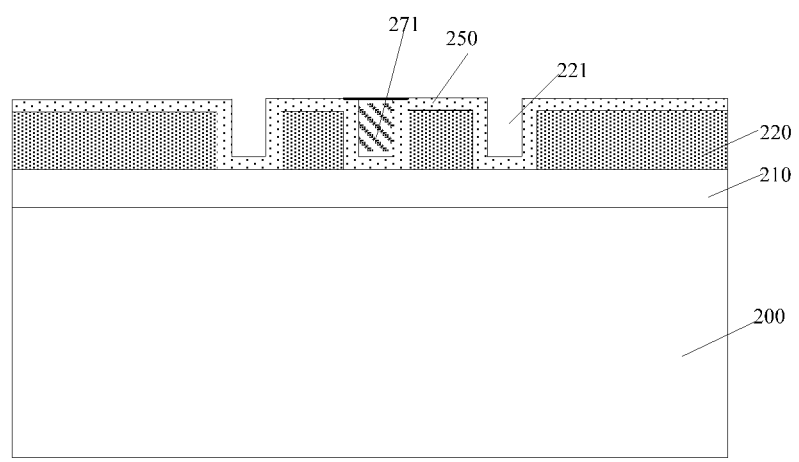

Further, returning to FIG. 35, the portion of the separation filling film formed above the top surface of the first mask layer may be removed, such that a separation filling layer may be formed in the first trench, the separation filling layer dividing the first trench into portions arranged in the second direction (S10). FIG. 24 illustrates a schematic view of a semiconductor structure consistent with various embodiments of the present disclosure. Specifically, FIG. 24 shows the semiconductor structure from a view direction consistent with that in FIG. 23.

Referring to FIG. 24, the portion of the separation filling film 270 formed above the top surface of the first mask layer 220 may be removed, such that a separation filling layer 271 may be formed in the first trench 221. The separation filling layer 271 may divide the first trench 221 into portions arranged in the second direction Y.

In one embodiment, the separation filling film 270 and the blocking layer 260 may be etched back until the surface of the sidewall film 250 on the top surface of the first mask layer 220 is exposed. As such, the separation filling layer 270 may be formed in the first trench 221. In addition, during the process of etching back the separation filling film 270 and the blocking layer 260, the portion of the blocking layer 260 formed in the first trench 221 may be removed.

Figure 25:
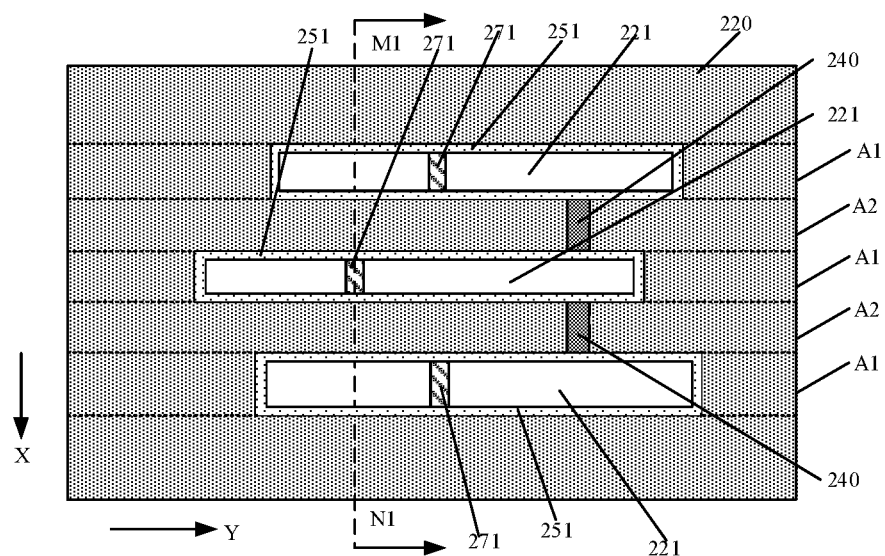
Figure 26:
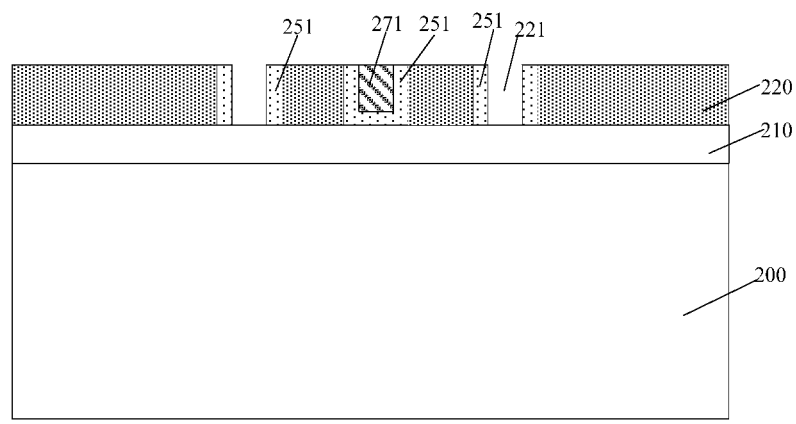

Further, returning to FIG. 35, after etching back the separation filling film and the blocking layer to expose the surface of the sidewall film formed on the top surface of the first mask layer, the sidewall film may be etched back to form a sidewall spacing layer until the top surface of the first mask layer is exposed (S410). FIGS. 25-26 illustrate schematic views of a semiconductor structure consistent with various embodiments of the present disclosure. Specifically, FIG. 26 shows the semiconductor structure from a view direction consistent with that in FIG. 24, and FIG. 25 shows the semiconductor structure from a view direction consistent with that in FIG. 23. That is, FIG. 26 illustrates a schematic cross-sectional view of the semiconductor structure shown in FIG. 25 in the M1-N1 direction.

Referring to FIGS. 25-26, after etching back the separation filling film 270 and the blocking layer 260 to expose the surface of the sidewall film 250 formed on the top surface of the first mask layer 220, the sidewall film 250 may be etched back to form a sidewall spacing layer 251 until the top surface of the first mask layer 220 is exposed.

In one embodiment, the sidewall spacing layer 251 may be located on the sidewalls of the first trench 221. The thickness of the sidewall spacing layer 251 may be in a range of approximately 10 nm to 30 nm, e.g. 10 nm, 15 nm, 20 nm, or 30 nm.

In one embodiment, the sidewall spacing layer 251 may be formed on both sides of the separation filling layer 271 in the first direction X. As such, the first trench 221 may be divided into portions arranged in the second direction Y only by the separation filling layer 271. Because the distance between the two portions of the first trench 221 that are respectively located on the two sides of the separation filling layer 271 in the second direction Y is the size of the separation filling layer 271 in the second direction Y, the distance between the two portions of the first trenches 221 that are respectively located on the two sides of the separation filling layer 271 in the second direction Y may be small.

In one embodiment, the separation filling layer 271 may be formed during the process of forming the sidewall spacing layer 251. Therefore, the material under the separation filling layer 271 may include the sidewall spacing layer 251.

In one embodiment, the separation filling layer 271 may be made of a material including $SiO_2$, SiN, $TiO_2$, TiN, AlN, or $Al_2O_3$, and the sidewall spacing layer 251 may be made of a material including $SiO_2$, SiN, $TiO_2$, TiN, AlN, or $Al_2O_3$. In one embodiment, the material of the sidewall spacing layer 251 may be different from the material of the separation filling layer 271.

In one embodiment, because the overlapping region of the blocking-layer opening 261 and the first trench 221 may be used to define the position of the separation filling layer 271, the size of the separation filling layer 271 may be small in the first direction X. For example, the width of the blocking-layer opening 261 in the second direction Y may be used to define the size of the separation filling layer 271 in the second direction Y. Therefore, when the width of the blocking-layer opening 261 in the second direction Y is small, the size of the separation filling layer 271 may also be small.

In one embodiment, the separation filling layer 271 may not extend to the second region A2, and thus the separation filling layer 271 may not affect the position where the second trench is divided.

In one embodiment, the size of the separation filling layer 271 in the first direction X may be in a range of approximately 10 nm to 60 nm, the size of the doped separation layer 250 in the second direction Y may be in a range of approximately 10 nm to 40 nm.

In one embodiment, forming the separation filling layer 271 during the process of forming the sidewall spacing layer 251 may have the following advantages. The separation filling film 270 and the blocking layer 260 are etched back until the surface of the sidewall film 250 formed on the top surface of the first mask layer 220 is exposed. Therefore, the process of etching back the separation filling film 270 and the blocking layer 260 may not need to stop at the top surface of the first mask layer 220, such that damage to the top surface of the first mask layer 220 due to etching may be insignificant. The process of etching back the separation filling film 270 and the blocking layer 260 may be easily stopped in the sidewall film 250. When the first mask layer 220 is made of an amorphous material, the chemical bonds in the amorphous silicon may be weak, such that the process of etching back the separation filling film 270 and the blocking layer 260 may not be easily stopped at the top surface of the first mask layer 220. Therefore, by stopping the etching back process in the sidewall film 250, the end point for etching back the separation filling film 270 and the blocking layer 260 may be accurately controlled. Further, because the sidewall spacing layer 251 is not formed on the two sides of the separation filling layer 271, the first trench 221 may be divided into portions arranged in the second direction Y only by the separation filling layer 271. Therefore, the distance between the two portions of the first trench 221 that are respectively located on the two sides of the separation filling layer 271 in the second direction Y may be small.

In some embodiments, the separation filling layer may be formed after forming the sidewall spacing layer. As such, the sidewall spacing layer is formed on the sidewalls of the first trench, the sidewall spacing layer is not formed under the separation filling layer, and the sidewall spacing layer is not formed on the two sidewalls of the separation filling layer in the second direction either. The material of the separation filling layer may or may not be the same as the material of the sidewall spacing layer.

In other embodiments, the sidewall spacing layer may be formed after forming the separation filling layer. As such, the sidewall spacing layer is formed on the sidewalls of the first trench, the sidewall spacing layer is formed on the two sidewalls of the separation filling layer in the second direction but not on the two sidewalls of the separation filling layer in the first direction. In addition, the sidewall spacing layer is not formed under the separation filling layer. The material of the separation filling layer may or may not be the same as the material of the sidewall spacing layer.

Further, in one embodiment, after forming the sidewall spacing layer 251 and the separation filling layer 271, the portion of the first mask layer 220 formed outside of the trench region may be implanted with doping ions. After implanting doping ions into the portion of the first mask layer 220 formed outside of the trench region, the portion of the first mask layer 220 formed in the trench region and on the two sides of the doped separation layer 240 may be removed through etching, such that a second trench may be formed in the first mask layer 220 on the second region of the to-be-etched layer 200. The doped separation layer 240 may divide the second trench into portions arranged in the second direction Y, and the second trench may expose the sidewall spacing layer such that the sidewall spacing layer may serve as a portion of the sidewall of the second trench.

Figure 27:
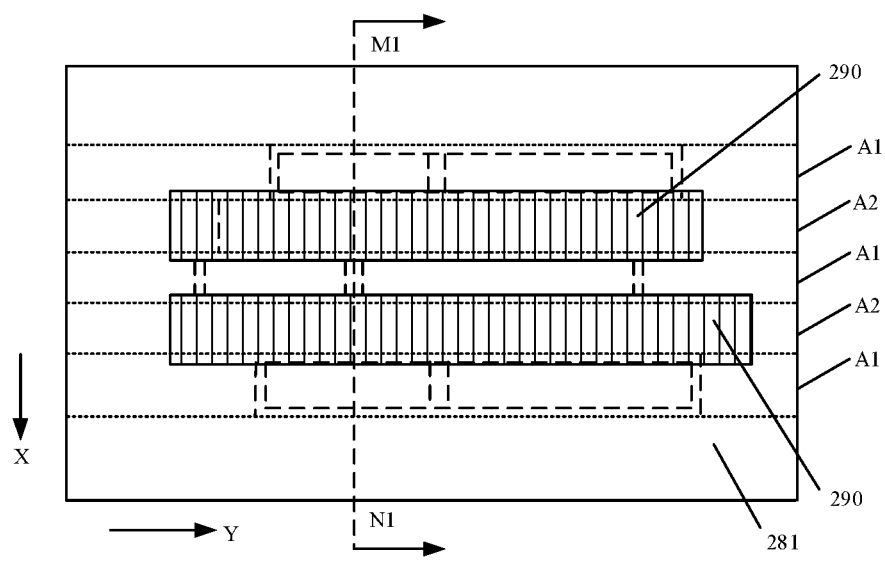
Figure 28:
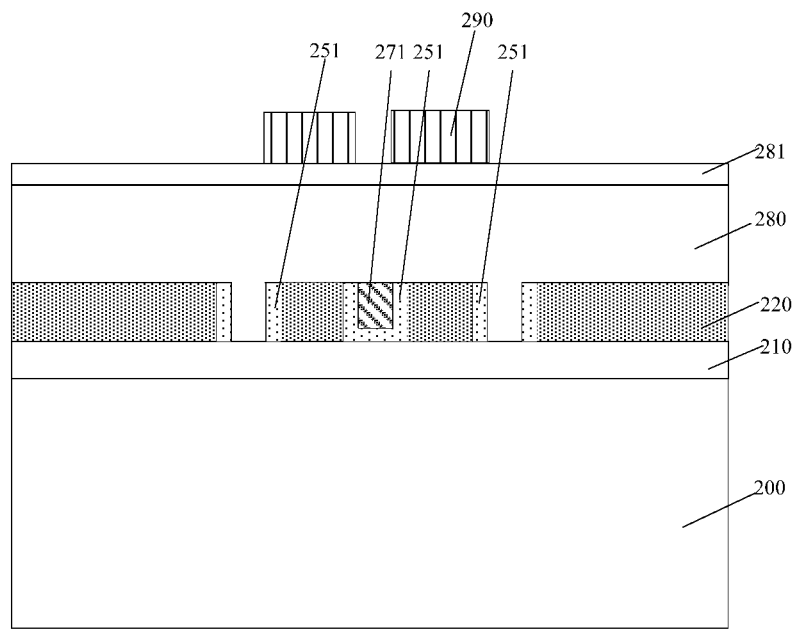

Further, returning to FIG. 35, a third planarization layer may be formed in the first trench and also on the first trench, the first mask layer, the sidewall spacing layer, the separation filling layer, and the doped separation layer; a third bottom anti-reflective layer may be formed on the third planarization layer; and then a third photoresist layer may be formed and patterned on the third bottom anti-reflective layer, the third photoresist layer covering the portion of the third bottom anti-reflective layer formed in the trench region and exposing the portion of the third bottom anti-reflective layer on the first region as well as the portion of the third bottom anti-reflective layer on the second region surrounding the trench region (S411). FIGS. 27-28 illustrate schematic views of a semiconductor structure consistent with various embodiments of the present disclosure. Specifically, FIG. 28 shows the semiconductor structure from a view direction consistent with that in FIG. 26, and FIG. 27 shows the semiconductor structure from a view direction consistent with that in FIG. 25. That is, FIG. 28 illustrates a schematic cross-sectional view of the semiconductor structure shown in FIG. 27 in the M1-N1 direction.

Referring to FIGS. 27-28, a third planarization layer 280 may be formed in the first trench 221 and also on the first trench 221, the first mask layer 220, the sidewall spacing layer 251, the separation filling layer 271, and the doped separation layer 240. Further, a third bottom anti-reflective layer 281 may be formed on the third planarization layer 280, and then a third photoresist layer 290 may be formed and patterned on the third bottom anti-reflective layer 281. The third photoresist layer 290 may cover the portion of the third bottom anti-reflective layer 281 in the trench region, and may expose the portion of the third bottom anti-reflective layer 281 on the first region A1 as well as the portion of the third bottom anti-reflective layer 281 on the second region A2 around the trench region.

In one embodiment, the third photoresist layer 290 may also extend to the sidewall spacing layer 251 along the first direction X, so that the size of the third photoresist layer 290 in the first direction X may be allowed to be made large. As such, the subsequently-formed second trench may also be able to extend to a portion of the first region A1, and thus the width of a portion of the second trench in the first direction X may increase. In other embodiments, the third photoresist layer may not extend to the sidewall spacing layer along the first direction.

In other embodiments, the third photoresist layer in adjacent second regions A2 may be connected to each other. That is, the third photoresist layer may extend onto the first trench and also onto the first mask layer on the both sides of the first trench along the second direction. As such, the second trenches subsequently formed in the two adjacent second regions may be connected to each other, and the second trenches formed on adjacent second regions may be able to form an annular structure.

Figure 29:
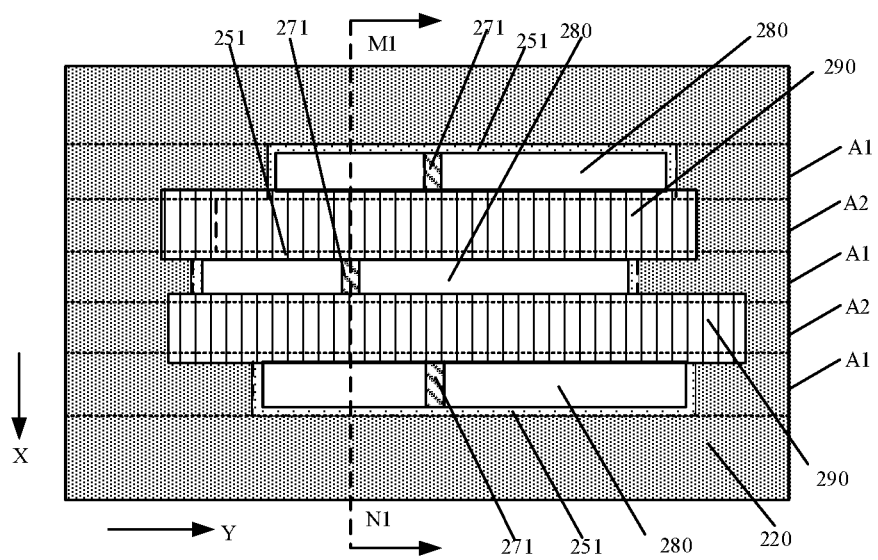
Figure 30:
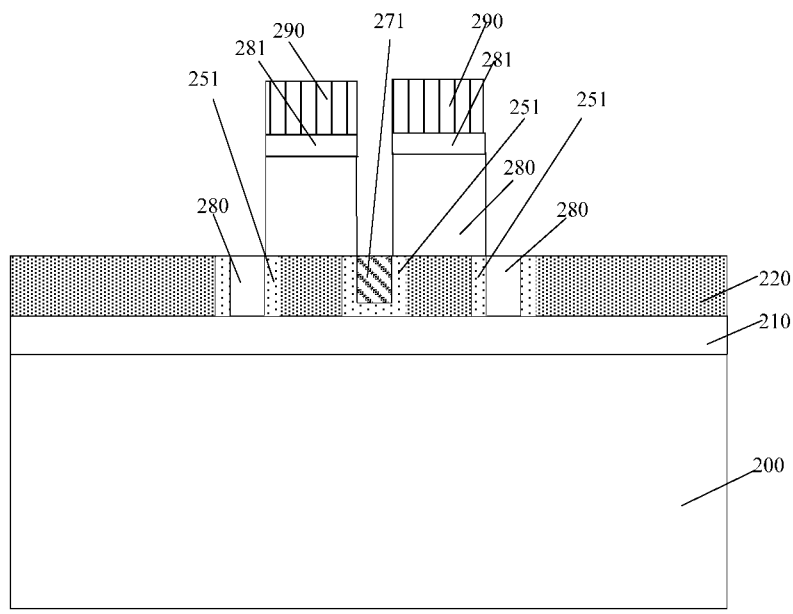

Further, returning to FIG. 35, the third bottom anti-reflective layer and the third planarization layer may be etched using the third photoresist layer as an etch mask until the top surface of the first mask layer is exposed, the third planarization layer may be retained in the first trench (S412). FIGS. 29-30 illustrate schematic views of a semiconductor structure consistent with various embodiments of the present disclosure. Specifically, FIG. 30 shows the semiconductor structure from a view direction consistent with that in FIG. 28, and FIG. 29 shows the semiconductor structure from a view direction consistent with that in FIG. 27. That is, FIG. 30 illustrates a schematic cross-sectional view of the semiconductor structure shown in FIG. 29 in the M1-N1 direction.

Referring to FIGS. 29-30, the third bottom anti-reflective layer 281 and the third planarization layer 280 may be etched using the third photoresist layer 290 as an etch mask until the top surface of the first mask layer 220 is exposed. The third planarization layer 280 may be retained in the first trench 221. That is, the portion of the third planarization layer 280 formed in the first trench 221 may not be removed.

Figure 31:
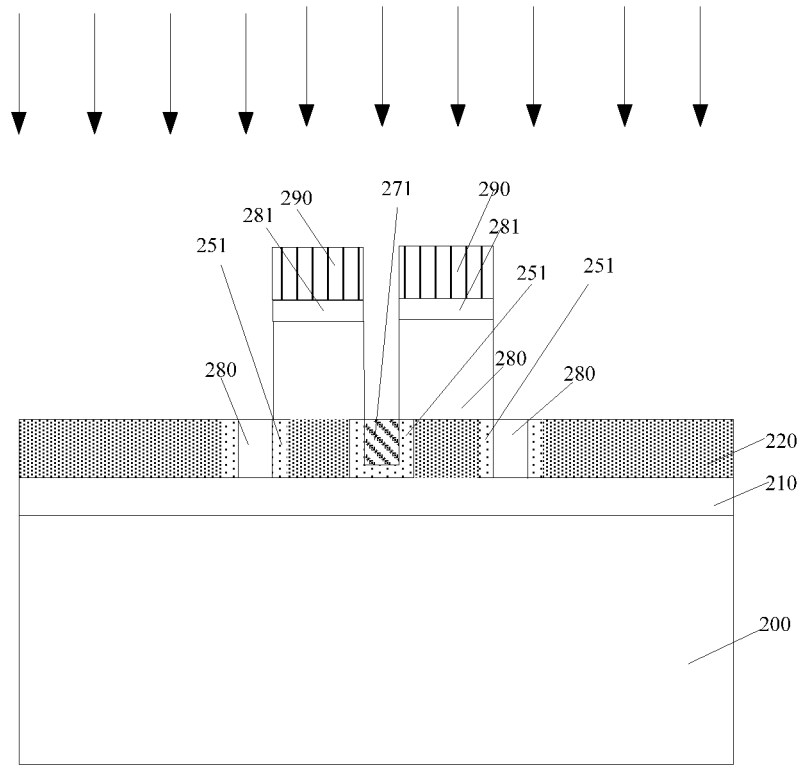

Further, returning to FIG. 35, doping ions may be implanted into the portion of the first mask layer formed outside of the trench region using the third photoresist layer as a mask (S413). FIG. 31 illustrates a schematic view of a semiconductor structure consistent with various embodiments of the present disclosure. Specifically, FIG. 31 shows the semiconductor structure from a view direction consistent with that in FIG. 30.

Referring to FIG. 31, doping ions may be implanted into the portion of the first mask layer 220 formed outside of the trench region using the third photoresist layer 290 as a mask. In one embodiment, doping ions may be implanted into the portion of the first mask layer 220 formed on the first region A1 and also into the portion of the first mask layer 220 formed on the second region A2 but outside of the trench region. The doping ions implanted into the portion of the first mask layer 220 formed outside of the trench region may have a same type as the doping ions implanted into the doped separation layer 240.

In one embodiment, because the portion of the third planarization layer 280 formed in the first trench 221 may be retained, the third planarization layer 280 may be able to prevent the doping ions from being implanted into the material layer at the bottom of the first trench 221, and thus the influence on the etching effect of the material at the bottom of the first trench 221 may be avoided.

Figure 32:
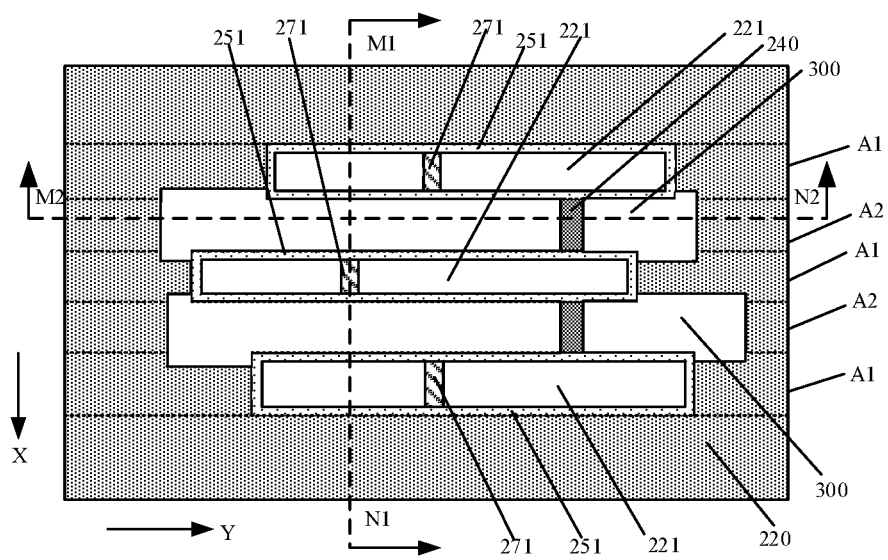
Figure 33:
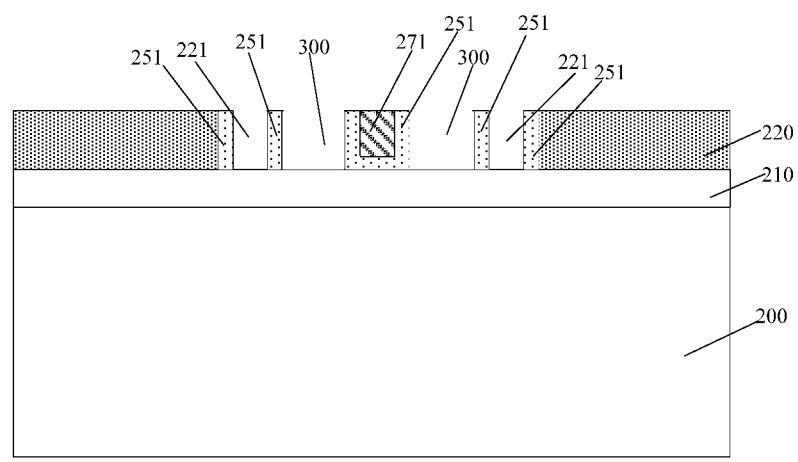

Further, returning to FIG. 35, after implanting the doping ions into the portion of the first mask layer formed outside of the trench region using the third photoresist layer as the etch mask, the third planarization layer, the third bottom anti-reflective layer, and the third photoresist layer may be removed, and then the portion of the first mask layer formed in the trench region on both sides of the doped separation layer may be removed through etching to form a second trench in the portion of the first mask layer on the second region of the to-be-etched layer, the doped separation layer dividing the second trench into portions arranged in the second direction, and the second trench exposing the sidewall spacing layer (S414). FIGS. 32-34 illustrate schematic views of a semiconductor structure consistent with various embodiments of the present disclosure. Specifically, FIG. 33 illustrates a schematic cross-sectional view of the semiconductor structure shown in FIG. 32 in an M1-N1 direction, and FIG. 34 illustrates a schematic cross-sectional view of the semiconductor structure shown in FIG. 32 in an M2-N2 direction.

Referring to FIGS. 32-34, after implanting the doping ions into the portion of the first mask layer 220 formed outside of the trench region using the third photoresist layer 290 as the etch mask, the third planarization layer 280, the third bottom anti-reflective layer 281, and the third photoresist layer 290 may be removed, and then the portion of the first mask layer 220 formed in the trench region on both sides of the doped separation layer 240 may be removed through etching to form a second trench 300 in the portion of the first mask layer 220 on the second region A2 of the to-be-etched layer 200. The doped separation layer 240 may divide the second trench 300 into portions arranged in the second direction Y, and the second trench 300 may expose the sidewall spacing layer 251 such that the sidewall spacing layer 251 may serve as a portion of the sidewall of the second trench 300.

In one embodiment, the extension direction of the second trench 300 may be parallel to the second direction Y. In one embodiment, the process performed to etch and remove the portion of the first mask layer 220 that is formed in the trench region on both sides of the doped separation layer 240 may be a wet etching process.

In one embodiment, doping ions may be implanted into the first mask layer 220, and the doping ions may clearly change the etching effect of the first mask layer in a wet etching process. Therefore, the portion of the first mask layer 220 formed in the trench region on both sides of the doped separation layer 240 may be removed using a wet etching process.

During the process of removing the portion of the first mask layer 220, the etching rate of the undoped portion of the first mask layer 220 may be larger than the etching rate of doped portion of the first mask layer 220. For example, in one embodiment, during the process of removing the portion of the first mask layer 220 formed in the trench region on both sides of the doped separation layer 240, the ratio of the etching rate of the undoped portion of the first mask layer 220 to the etching rate of the doped portion of the first mask layer 220 may be larger than 100, e.g. 150.

In one embodiment, the doping ions implanted into the portion of the first mask layer 220 formed outside of the trench region may be the same type as the doping ions implanted into the doped separation layer 240. Therefore, during the process of removing the portion of the first mask layer 220 formed in the trench region on both sides of the doped separation layer 240, the doped separation layer 240 may not be etched and removed.

In one embodiment, the width of the second trench 300 in the first direction X may be in a range of approximately 10 nm to 60 nm. The doped separation layer 240 may divide the second trench 300 into portions arranged in the second direction Y.

In one embodiment, the second trench 300 may expose the sidewall spacing layer 251 and thus the sidewall spacing layer 251 may serve as a portion of the sidewall of the second trench 300. As such, the first trench 221 and the second trench 300 may be separated by the sidewall spacing layer 251.

In one embodiment, the method may also include the following exemplary steps. The portion of the to-be-etched layer 200 at the bottom of the first trench 221 may be etched to form a first target trench in the to-be-etched layer 200 of the first region A1. The portion of the to-be-etched layer 200 at the bottom of the second trench 300 may be etched to form a second target trench in the second region A2 of the to-be-etched layer 200. Further, a first conductive layer may be formed in the first target trench, and a second conductive layer may be formed in the second target trench.

In one embodiment, the method may further include the following steps. Prior to etching the portion of the to-be-etched layer at the bottom of the first trench and the portion of the to-be-etched layer at the bottom of the second trench, the second adhesive layer, the bottom hard mask layer, and the first adhesive layer formed at the bottom of the first trench may be etched to form a first hard mask trench in the bottom hard mask layer at the bottom of the first trench, and the second adhesive layer, the bottom hard mask layer, and the first adhesive layer formed on the bottom of the second trench may be etched to form a second hard mask trench in the bottom hard mask layer at the bottom of the second trench.

In one embodiment, after etching the second adhesive layer, the bottom hard mask layer, and the first adhesive layer at the bottom of the first trench and the bottom hard mask layer, and the first adhesive layer at the bottom of the second trench, and prior to forming the first conductive layer and the second conductive layer, the first mask layer and the second adhesive layer may be removed. After removing the first mask layer and the second adhesive layer, the to-be-etched layer at the bottom of the first hard mask trench may be etched to form a first target trench in the to-be-etched layer, and the to-be-etched layer at the bottom of the second hard mask trench may be etched to form a second target trench in the to-be-etched layer. After forming the first target trench and the second target trench, a conductive film may be formed in the first target trench and the second target trench and also on the bottom hard mask layer. The conductive film may be planarized until the top surface of the bottom hard mask layer is exposed. As such, the first conductive layer may be formed in the first target trench and the second conductive layer may be formed in the second target trench. Further, the bottom hard mask layer and the first adhesive layer may be removed.

In one embodiment, the first conductive layer and the second conductive layer may be made of a metal, such as copper or aluminum. In other embodiments, the first conductive layer and the second conductive layer may be made of an alloy.

Further, the present disclosure also provides a semiconductor device. FIGS. 32-34 illustrate schematic views of an exemplary semiconductor device consistent with various embodiments of the present disclosure. Specifically, FIG. 33 illustrates a schematic cross-sectional view of the semiconductor device shown in FIG. 32 in an M1-N1 direction, and FIG. 34 illustrates a schematic cross-sectional view of the semiconductor device shown in FIG. 32 in an M2-N2 direction.

Referring to FIGS. 32-34, the semiconductor device may include a to-be-etched layer 200. The to-be-etched layer 200 may include a plurality of discrete first regions A1 and a plurality of discrete second regions A2. The plurality of first regions A1 and the plurality of second regions A2 may be arranged alternately along a first direction X. For a first region A1 adjacent to a second region A2, the first region A1 and the second region A2 may adjoin each other, e.g., the first region A1 and the second region A2 may share an edge.

In one embodiment, the plurality of first regions A1 may be arranged along the first direction X, and the plurality of second regions A2 may also be arranged along the first direction X. The plurality of first regions A1 and the plurality of second regions A2 arranged alternatively along the first direction X may refer to that only one second region A2 may be located between two adjacent first regions A1, and only one first region A1 may be located between two adjacent second regions A2. In some embodiments, the total number of the first regions may equal to the total number of the second regions.

In one embodiment, the to-be-etched layer 200 may be made of a material including silicon oxide or a low-k dielectric material (e.g., a material with a relative dielectric constant k smaller than or equal to 3.9).

In one embodiment, the semiconductor device may include a bottom hard mask layer 210 formed on the to-be-etch layer 200 in both the plurality of first regions A1 and the plurality of second regions A2, and a first mask layer 220 formed on the bottom hard mask layer 210. The first mask layer 220 may be made of a material including amorphous silicon, and may be implanted with doping ions.

Further, the semiconductor device may include a plurality of first trenches 221 formed in the first mask layer 220 of the plurality of first regions A1 with each first trench 221 surrounded by a sidewall spacing layer 251. The first trench 221 may be divided into portions arranged in the first direction X by a separation filling layer 271. In one embodiment, each first trench 221 may extend along a second direction Y, which is perpendicular to the first direction X.

In one embodiment, the width of the first trench 221 in the first direction X may be in a range of approximately 10 nm to 60 nm. In the first direction X, the distance between adjacent first trenches 221 may be in a range of approximately 10 nm to 60 nm.

In one embodiment, the separation filling layer 271 may be made of a material including $SiO_2$, $SiN$, $TiO_2$, $TiN$, $AlN$, or $Al_2O_3$, and the sidewall spacing layer 251 may be made of a material including $SiO_2$, $SiN$, $TiO_2$, $TiN$, $AlN$, or $Al_2O_3$. In one embodiment, the material of the sidewall spacing layer 251 may be different from the material of the separation filling layer 271.

In one embodiment, the sidewalls of the separation filling layer 271 in the first direction X are not covered by the sidewall spacing layer 251, and thus the first trench 221 may be divided into portions arrange in the second direction Y only by the separation filling layer 271. Therefore, the distance between the two portions of the first trench 221 that are respectively located on the two sides of the separation filling layer 271 in the second direction Y may be small. Because the distance between the two portions of the first trench 221 that are respectively located on the two sides of the separation filling layer 271 in the second direction Y is the size of the separation filling layer 271 in the second direction Y, the distance between the two portions of the first trenches 221 that are respectively located on the two sides of the separation filling layer 271 in the second direction Y may be small.

In one embodiment, the thickness of the sidewall spacing layer 251 may be in a range of approximately 10 nm to 30 nm, e.g. 10 nm, 15 nm, 20 nm, or 30 nm. The size of the separation filling layer 271 in the first direction X may be in a range of approximately 10 nm to 60 nm, and the size of the separation filling layer 271 in the second direction Y may be in a range of approximately 10 nm to 40 nm.

Further, the semiconductor device may also include a plurality of second trenches 300 formed in the portion of the first mask layer 220 on the second region A2 of the to-be-etched layer 200 with each second trench 300 divided into portions arranged in the second direction Y by a doped separation layer 240. In one embodiment, the second trench 300 may expose the sidewall spacing layer 251 formed surrounding the first trench 221, and thus the sidewall spacing layer 251 may serve as a portion of the sidewall of the second trench 300. As such, the second trench 300 may be separated from an adjacent first trench 221 by the sidewall spacing layer 251.

In one embodiment, the doped separation layer 240 may contain doping ions including boron ions and arsenic ions. The width of the second trench 300 in the first direction X may be in a range of approximately 10 nm to 60 nm. In one embodiment, the size of the doped separation layer 240 in the first direction X may be in a range of approximately 10 nm to 60 nm, and the size of the doped separation layer 240 in the second direction Y may be in a range of approximately 10 nm to 40 nm.

Compared to existing semiconductor devices and fabrication methods, the disclosed semiconductor device and fabrication method may demonstrate the following exemplary advantages.

According to the disclosed semiconductor device and fabrication method, the size of the separation filling layer only requires to be small in the second direction. The separation filling layer is formed in the first trench, such that the size of the separation filling layer in the first direction is limited by the width of the first trench in the first direction. Therefore, the size of the separation filling layer in the first direction is small. As such, the size of the separation filling layer is small in both the first direction and the second direction, which satisfies the process requirements. Because the size of the separation filling layer in the second direction can be defined independently of the width of the first trench in the first direction, the difficulty in forming the separation filling layer may be reduced.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a semiconductor device, comprising:
   providing a to-be-etched layer, including a plurality of first regions and a plurality of second regions arranged alternately along a first direction, wherein for a first region of the plurality of first regions adjacent to a second region of the plurality of second regions, the first region and the second region adjoin each other, and the second region of the plurality of second regions includes a trench region adjoining an adjacent first region; and
   forming a first mask layer on the to-be-etched layer in both the plurality of first regions and the plurality of second regions;
   forming a doped separation layer in the first mask layer on the second region of the to-be-etched layer, wherein the doped separation layer divides the first mask layer formed in the trench region into portions arranged in a second direction perpendicular to the first direction;
   forming a first trench in the first mask layer on the first region;
   forming a separation filling layer in the first trench, wherein the separation filling layer divides the first trench into portions arranged in the second direction;
   after forming the separation filling layer, implanting doping ions into the first mask layer formed outside of the trench region of the second region; and
   after implanting the doping ions into the first mask layer formed outside of the trench region, removing the first mask layer formed in the trench region on both sides of the doped separation layer to form a second trench in the first mask layer on the second region of the to-be-etched layer, wherein the doped separation layer divides the second trench into portions arranged in the second direction.

2. The method according to claim 1, wherein forming the separation filling layer includes:
   forming a blocking layer on the first mask layer and in a portion of the first trench, wherein the blocking layer includes a blocking-layer opening located on a portion of the first trench, the blocking-layer opening and the first trench are connected to each other, and the blocking-layer opening extends to the second region along the first direction;
   forming a separation filling film in the blocking-layer opening and the first trench exposed by the blocking-layer opening, and also on the blocking layer;
   removing a portion of the separation filling film formed above a top surface of the first mask layer to form the separation filling layer; and
   removing the blocking layer after removing the portion of the separation filling film formed above the top surface of the first mask layer.

3. The method according to claim 2, wherein:
   the blocking layer is made of a material including a carbon-containing organic polymer.

4. The method according to claim 2, wherein forming the blocking layer includes:
   forming a first planarization film on the first mask layer and in the first trench;
   forming a first bottom anti-reflective layer on the first planarization film;

forming and patterning a first photoresist layer on the first bottom anti-reflective layer, wherein the first photoresist layer includes a first lithography opening located on a portion of the first trench, and the first lithography opening extends to the second region along the first direction;

removing a portion of the first bottom anti-reflective layer and the first planarization film on a bottom of the first lithography opening through an etching process using the first photoresist layer as an etch mask, such that the first planarization film forms the blocking layer; and removing the first photoresist layer and the first bottom anti-reflective layer.

5. The method according to claim 1, wherein:
a size of the separation filling layer in the first direction is in a range of approximately 10 nm to 60 nm; and
a size of the separation filling layer in the second direction is in a range of approximately 10 nm to 40 nm.

6. The method according to claim 1, wherein:
the first trench is formed after forming the doped separation layer.

7. The method according to claim 1, wherein:
the doped separation layer is formed after forming the first trench.

8. The method according to claim 7, wherein forming the doped separation layer includes:
forming a second planarization layer on the first mask layer and in the first trench, wherein the second planarization layer fills up the first trench, and a top surface of the second planarization layer is above an opening of the first trench;
forming a second bottom anti-reflective layer on the second planarization layer;
forming and patterning a second photoresist layer on the second bottom anti-reflective layer, wherein the second photoresist layer includes a second lithography opening located on the second region on a side of the first trench along the first direction, and the second lithography opening extends to a portion of the first trench along the first direction;
etching a portion of the second bottom anti-reflective layer and the second planarization layer on a bottom of the second lithography opening using the second photoresist layer as an etch mask until a top surface of the first mask layer is exposed;
implanting doping ions into the first mask layer on the bottom of the second lithography opening using the second photoresist layer and the second planarization layer as an mask, wherein the first mask layer on the second region forms the doped separation layer; and
removing the second planarization layer, the second bottom anti-reflective layer, and the second photoresist layer.

9. The method according to claim 1, wherein:
the doping ions include boron ions or arsenic ions.

10. The method according to claim 1, wherein:
the doped separation layer is located between two adjacent first trenches in the first direction; and
the method further includes:
after forming the doped separation layer and prior to implanting the doping ions into the first mask layer outside of the trench region, forming a sidewall spacing layer on sidewalls of the first trench, wherein:

the separation filling layer is formed after forming the doped separation layer, and
after forming the second trench, sidewalls of the second trench expose the sidewall spacing layer.

11. The method according to claim 10, wherein:
the separation filling layer is formed after forming the sidewall spacing layer.

12. The method according to claim 10, wherein:
the sidewall spacing layer is formed after forming the separation filling layer.

13. The method according to claim 10, wherein:
the separation filling layer is formed during a process of forming the sidewall spacing layer.

14. The method according to claim 13, wherein:
a material of the separation filling layer is different from a material of the sidewall spacing layer; and
forming the mask sidewall layer and the separation filling layer includes:
forming a sidewall film on sidewall and bottom surfaces of the first trench, a top surface of the first mask layer and a surface of the doped separation layer;
forming a blocking layer on the first mask layer and the sidewall film, and also in a portion of the first trench, wherein the blocking layer includes a blocking-layer opening located on a portion of the first trench, the blocking-layer opening and the first trench are connected to each other, the blocking-layer opening extends to the second region along the first direction;
forming a separation filling film on the blocking layer and the sidewall film and also in the blocking-layer opening and the first trench exposed by the blocking-layer opening;
etching back the separation filling film and the blocking layer to form a separation filling layer until a surface of the sidewall film on the top surface of the first mask layer is exposed, wherein in a process of etching back the separation filling film and the blocking layer, the blocking layer formed in the first trench is also removed; and
after etching back the separation filling film and the blocking layer, etching back the sidewall film to form the sidewall spacing layer until the top surface of the first mask layer is exposed.

15. The method according to claim 1, wherein:
a process of removing the first mask layer formed in the trench region on both sides of the doped separation layer is a wet etching process.

16. The method according to claim 15, wherein:
in the process of removing the first mask layer formed in the trench region on both sides of the doped separation layer, an etching rate of an undoped portion of the first mask layer is larger than an etching rate of a doped portion of the first mask layer.

17. The method according to claim 1, further including:
etching the to-be-etched layer on a bottom of the first trench to form a first target trench in the to-be-etched layer;
etching the to-be-etched layer on a bottom of the second trench to form a second target trench in the to-be-etched layer;
forming a first conductive layer in the first target trench; and
forming a second conductive layer in the second target trench.

* * * * *